United States Patent [19]

Stoica

[11] Patent Number: 4,931,722
[45] Date of Patent: Jun. 5, 1990

[54] FLEXIBLE IMBEDDED TEST SYSTEM FOR VLSI CIRCUITS

[75] Inventor: Susana Stoica, Edina, Minn.

[73] Assignee: Control Data Corporation, Minneapolis, Minn.

[21] Appl. No.: 327,938

[22] Filed: Mar. 23, 1989

Related U.S. Application Data

[63] Continuation of Ser. No. 46,218, May 5, 1987, abandoned, which is a continuation-in-part of Ser. No. 796,047, Nov. 7, 1985, abandoned.

[51] Int. Cl.$^5$ .................. G01R 31/28; G06F 11/00
[52] U.S. Cl. .................. 371/22.5; 324/158 R; 371/15.1
[58] Field of Search ............ 324/73 R, 158 R, 73 AT; 371/20, 15.1, 16.1, 25.1, 22.5; 437/8

[56] References Cited

U.S. PATENT DOCUMENTS

| | | | |
|---|---|---|---|
| 4,244,048 | 1/1981 | Tsui | 324/73 R |
| 4,357,703 | 11/1982 | Van Brunt | 324/15 |
| 4,527,249 | 7/1985 | Van Brunt | 324/73 R |
| 4,701,920 | 10/1987 | Resnick | 324/73 R |
| 4,701,922 | 10/1987 | Kuboki | 371/25 |
| 4,764,926 | 8/1988 | Knight | 371/25 |

OTHER PUBLICATIONS

Built-In Self-Test Techniques, E. J. McCluskey, Apr., 1985, IEEE Design & Test, pp. 21-28.
Built-In Self-Test Structures, E. J. McCluskey, Apr. 1985 IEEE Design & Test, pp. 29-36.
Testing Semi-Custom Logic, E. J. McCluskey, Sep. 1985, Semiconductor International, pp. 118-123.

Primary Examiner—Reinhard J. Eisenzopf
Assistant Examiner—Vinh P. Nguyen
Attorney, Agent, or Firm—Cushman, Darby & Cushman

[57] ABSTRACT

A logic chip contains a plurality of ranks of flip-flops with combinational logic elements connected in between the flip-flop ranks. Each flip-flop has at least two distinct data paths. The first path is for the normal passage of data to combinational logic units following the rank of flip-flops, and the second path is a test path which is connected directly with the next rank of flip-flops. Operands may be shifted in parallel to bypass combinational logic units and may be directed to selected combinational logic for test purposes. The flip-flops in a rank may be serially scanned or operate in parallel to send specific operands through selected combinational logic units. It is adaptable to custom or semi-custom VLSI chip design and it teaches that any "component" (for example, a logic unit or a single element) may be tested individually using two data paths (one for test and one for operation or normal data). The test data output can be transmitted in parallel between the flip flop ranks, or it can go serially through the flip flop components of a given rank.

38 Claims, 26 Drawing Sheets

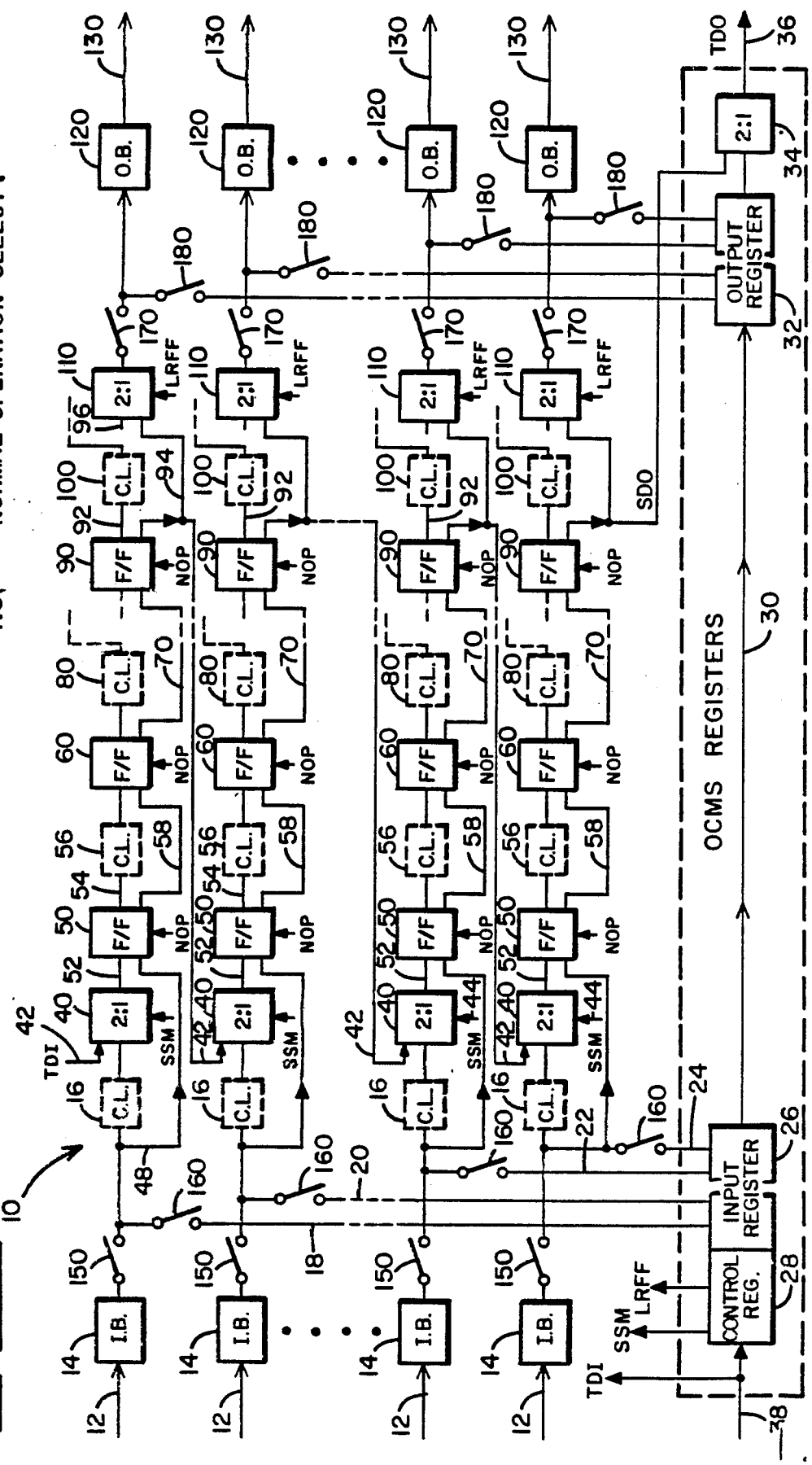

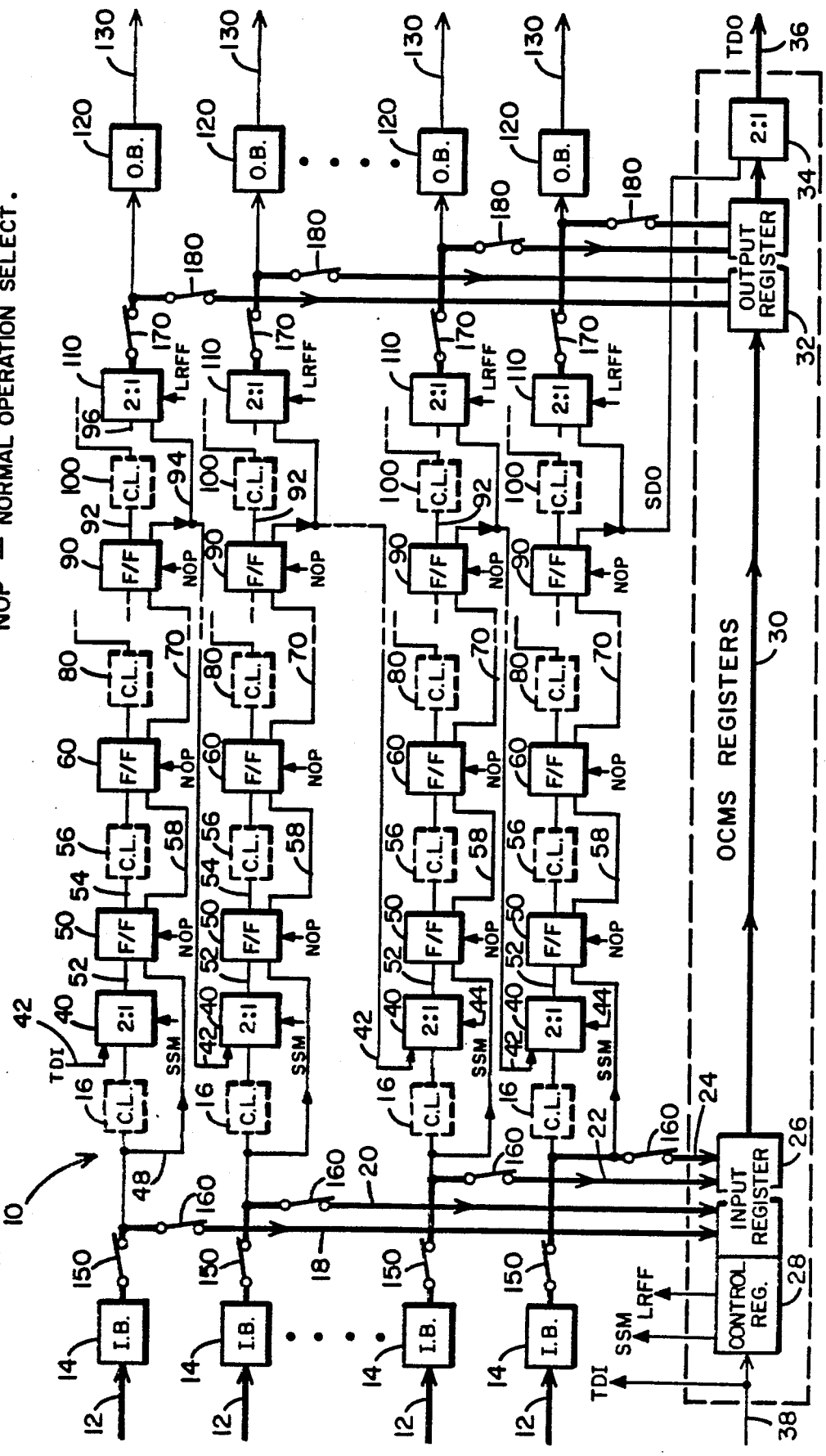

| NOP | CLOCK | DATA IN | TEST IN | OUT |
|---|---|---|---|---|
| X | — | X | X | Q |
| 1 | ⌐ | 1 | X | 1 |
| 1 | ⌐ | 0 | X | 0 |
| 0 | ⌐ | X | 1 | 1 |
| 0 | ⌐ | X | 0 | 0 |

| NOP | CLK EN | CLOCK | DATA IN | TEST IN | OUT |
|---|---|---|---|---|---|
| X | X | — | X | X | Q |
| 1 | 0 | ⌐⌐ | X | X | Q |
| 1 | 1 | ⌐⌐ | 1 | X | 1 |
| 1 | 1 | ⌐⌐ | 0 | X | 0 |
| 0 | X | ⌐⌐ | X | 1 | 1 |
| 0 | X | ⌐⌐ | X | 0 | 0 |

| NOP | SET | RESET | CLK EN | CLK | DATA IN | TEST IN | OUT |
|---|---|---|---|---|---|---|---|
| X | X | X | X | — | X | X | Q |
| 1 | 1 | 0 | X | ⌐⌐ | X | X | 1 |
| 1 | X | 1 | X | ⌐⌐ | X | X | 0 |
| 1 | 0 | 0 | 0 | ⌐⌐ | 1 | X | 1 |
| 1 | 0 | 0 | 0 | ⌐⌐ | 0 | X | 0 |
| 0 | X | X | X | ⌐⌐ | X | 1 | 1 |
| 0 | X | X | X | ⌐⌐ | X | 0 | 0 |

I.B. = INPUT BUFFER;
C.L. = COMBINATIONAL LOGIC;
F/F = MEMORY ELEMENT, I.E. FLIP-FLOP, COUNTER, RAM, ETC.;
NOP = NORMAL OPERATION ENABLE, FROM INPUT PIN INDEPENDENT OF RANDOM NUMBER GENERATOR;
SSM = SERIAL SCAN CONTROL, FROM CONTROL REGISTER OR INPUT PIN INDEPENDENT OF RANDOM NUMBER GENERATOR.

I.B. = INPUT BUFFER;
C.L. = COMBINATIONAL LOGIC;
F/F = MEMORY ELEMENT, I.E. FLIP-FLOP, COUNTER, RAM, ETC.;
NOP = NORMAL OPERATION ENABLE, FROM INPUT PIN INDEPENDENT OF RANDOM NUMBER GENERATOR;
SSM = SERIAL SCAN CONTROL, FROM CONTROL REGISTER OR INPUT PIN INDEPENDENT OF RANDOM NUMBER GENERATOR.

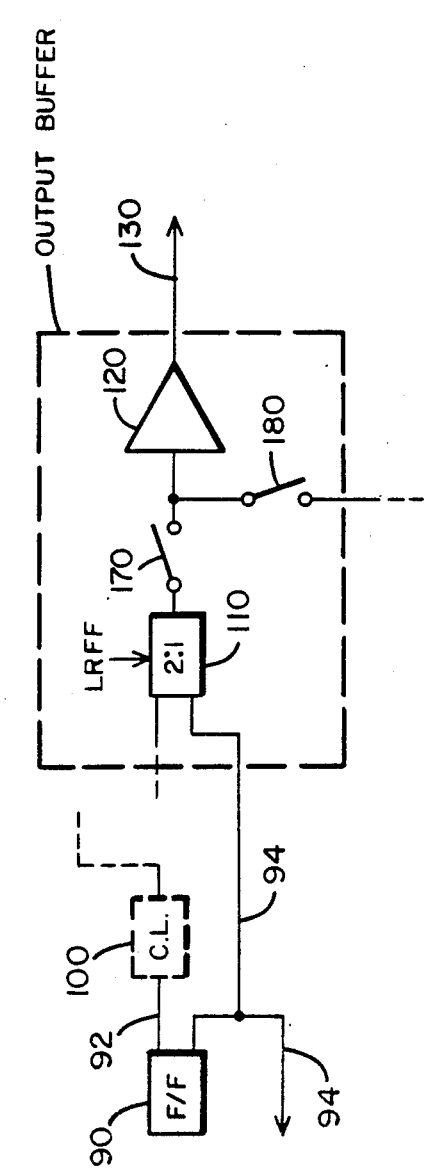
*Fig. 21A*
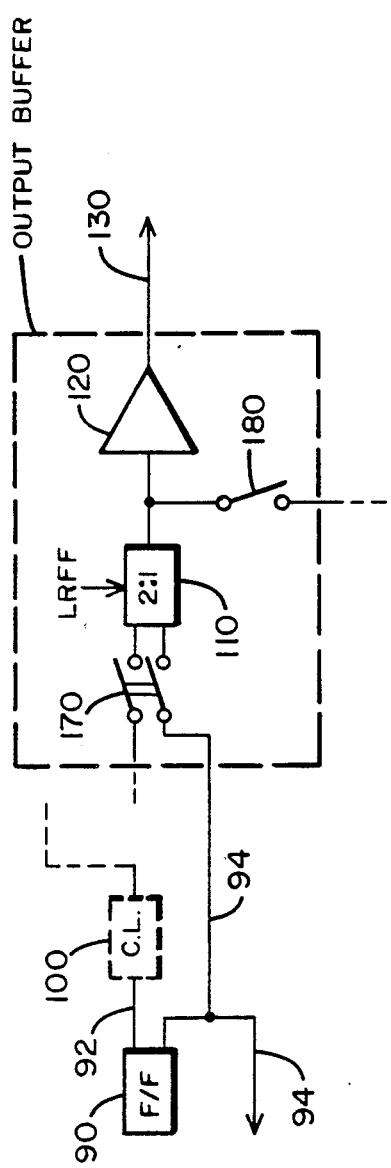
*Fig. 21B*
*Fig. 21*
LRFF = LAST RANK OF F/F TO OUTPUT CONTROL

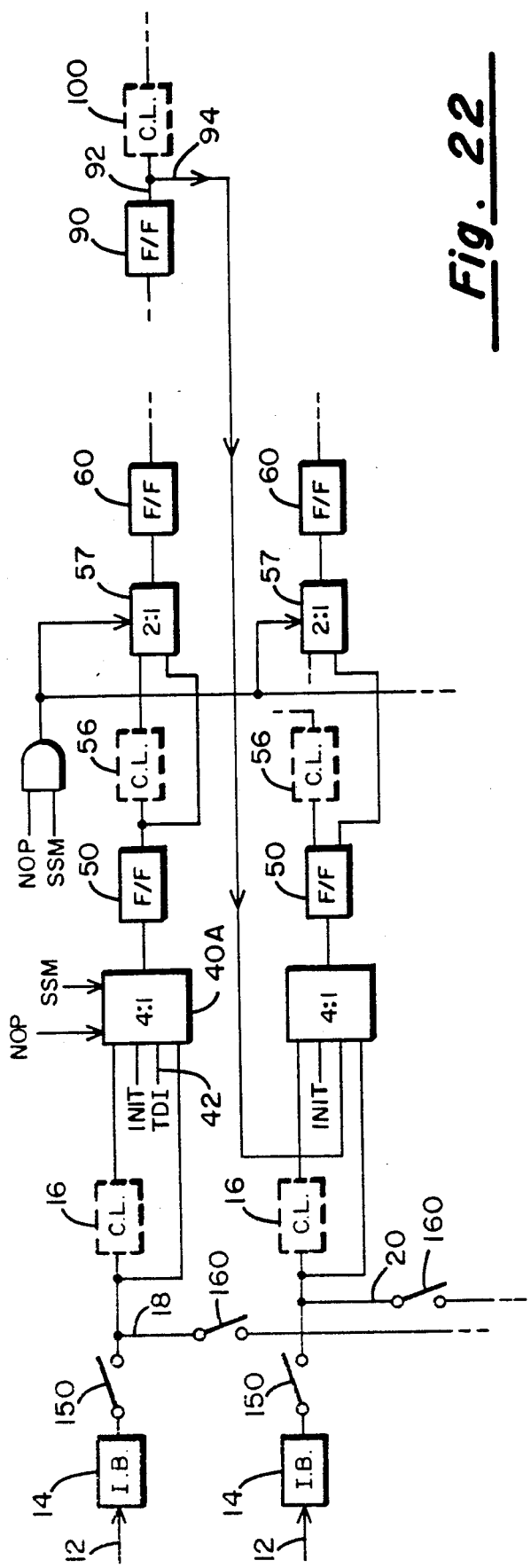

Fig. 22

INIT = INITIALIZATION DATA ('ZERO OR ONE');
I.B. = INPUT BUFFER;
C.L. = COMBINATIONAL LOGIC;
4:1 = 4 TO 1 MULTIPLEXOR CONTROLLED BY 'NOP' AND 'SSM';
2:1 = 2 TO 1 MULTIPLEXOR CONTROLLED BY A FUNCTION OF 'NOP' AND 'SSM';
F/F = ANY MEMORY ELEMENT, I.E. FLIP-FLOP, COUNTER, RAM, ETC.;
NOP = INPUT PIN INDEPENDENT OF THE BUILT-IN TEST INPUT REGISTER
      RANDOM NUMBER GENERATOR;
SSM = CONTROL REGISTER OUTPUT OR INPUT PIN INDEPENDENT OF THE INPUT REGISTER.

NOTE: THE 4:1 AND 2:1 MULTIPLEXORS CAN BE PART OF THE MEMORY
      ELEMENT DESIGN.

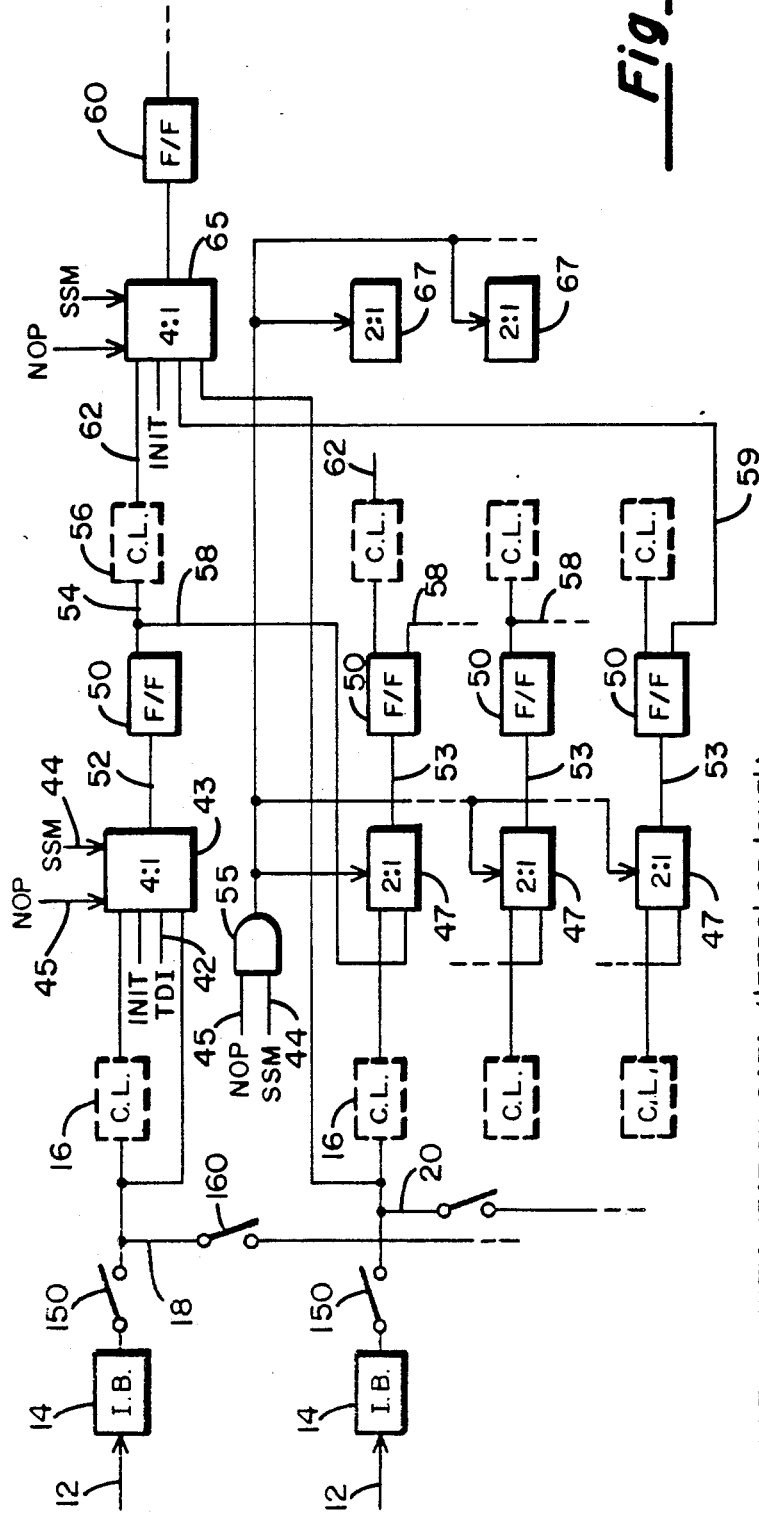

Fig. 23

INIT = INITIALIZATION DATA ('ZERO' OR 'ONE')
4:1 = 4 TO 1 MULTIPLEXOR CONTROLLED BY 'NOP' AND 'SSM';
2:1 = 2 TO 1 MULTIPLEXOR CONTROLLED BY A FUNCTION OF 'NOP' AND 'SSM';
I.B. = INPUT BUFFER;
F/F = ANY MEMORY ELEMENT, I.E. FLIP-FLOP, COUNTER, RAM, ETC.
C.L. = COMBINATIONAL LOGIC.
NOP = INPUT PIN INDEPENDENT OF THE INPUT REGISTER/RANDOM NUMBER GENERATOR;
SSM = CONTROL REGISTER OUTPUT OR INPUT PIN INDEPENDENT OF THE INPUT REGISTER;
INIT = '0' OR '1'. THIS INPUT IS USED FOR SYSTEM LEVEL INITIALIZATION BY FEEDING IN ALL F/F RAN/ 0's OR 1's ACCORDING TO THE INIT. VALUE.

NOTE: THE 4:1 AND 2:1 MULTIPLEXORS CAN BE INCORPORATED IN THE MEMORY ELEMENT DESIGNS.

FLEXIBLE IMBEDDED TEST SYSTEM FOR VLSI CIRCUITS

This is a continuation application of Ser. No. 07/046,218, filed 5/5/87, now abandoned, which was a C-I-P of Ser. No. 06/796,047 filed 11/07/85, now abandoned, for Flexible Imbedded Test System for VLSI Circuits.

BACKGROUND OF THE INVENTION

This invention relates to test systems for complex VLSI (Very Large Scale Integrated) circuit chips found in the state of the art digital electronics system. In particular, this invention relates to special test and diagnostic circuitry that resides on or is embedded in a VLSI chip together with the circuitry which performs the specified chip function. This test and diagnostic circuitry may be used for initial testing of the chip or testing at any time during the useful life of the chip and may include testing of the electronic system in which the chip resides. The flexible embedded test system is sometimes known as FITS.

Known in the prior art is U.S. Pat. No. 4,357,703 entitled "Test System for LSI Circuits Resident on LSI Chips." This patent shows a test system which has switchable gates for controlling internal data flow at the input and output of the logic, shift registers for serially receiving data and transmitting data in parallel and a test generator and receiver system. In practice, this system has been very useful in logic design. However, as VLSI logic gets more complex with an ever increasing number of gates on a chip, design and testing needs to become more sophisticated. The design in this patent does not provide adequate ability to look backward in the chip logic sequence from the output register to find the source of transient and intermittent faults. Thus, there is a need to provide for improved detection and isolation of error conditions within chip logic circuitry.

Also known in the prior art is U.S. Pat. No. 4,244,048 entitled "Chip and Wafer Configuration and Testing Method for Large Scale Integrated Circuits." This patent shows a scan design chip testing method which can be implemented both on individual chips and also on a wafer containing a number of chips during fabrication. This patent shows implementation of scan design technology which reduced to simplest terms refers to the ability of a register or a rank of flip-flops to serially scan data into and out of the rank for testing purposes but which normally conveys data in a parallel fashion from one stage of combinational logic to another stage of combinational logic. A chip having scan design can allow the entire chip contents or only selected operands to be read in or out. However, with scan design, the entire scan data path must be accessed every time it is used including portions which may not be of interest. All of this serial transfer of a one bit wide data path takes a lot of time.

As logic chips become larger and larger, the difficulty of using a scan design increases because of the number of control signals required and the number of bits contained in all of the flip-flop or register ranks on a large chip. These make the testing or diagnostic overhead sufficiently large that it becomes a problem in itself. For example, a large number of flip-flop bit sequences requires a very substantial data base of test operands and expected results. Similarly, each different chip type or design requires its own special testing and diagnostic sequences. Thus, while a scan design offers some advantages for determining the contents of the registers or flip-flops in a chip, it also has the burden of producing a cumbersome amount of data. Thus, there is a need to provide for a way of using the benefits of scan design but avoiding unnecessarily large data bases of test operands and for producing a more manageable chip testing routine.

SUMMARY OF THE INVENTION

The present invention is a system of diagnostic and testing circuitry which is incorporated into a LVSI chip to provide various diagnostic and maintenance testing and verification procedures. A logic chip according to the present invention is constructed of the necessary input buffers and output buffers for the intended logic function. The logic of the chip consists of various combinational logic elements and flip-flops serially connected in data paths between the input and output buffers.

In addition to the necessary combinational logic and flip-flops on the chip, the necessary elements of an on-chip maintenance system according to the disclosure of U.S. Pat. No. 4,357,703 are incorporated. Those units consist of a maintenance control register with its associated control input, an input serial to parallel register, an output serial to parallel register, which is connected in series, as well as interconnections with the various data paths on the chip. The input register has the necessary connections to provide pseudorandom number generating capabilities to produce test operands internally.

In addition, the logic paths have several ranks of flip-flops having special capabilities included. Early in the data path is a two-to-one multiplex switch which receives both the conventional logic input as well as an input for test data purposes. Normally, this test data input takes data from the last flip-flop in the adjacent logic chain so that all of the logic at the output end of the logic chain can be placed back at the beginning of an adjacent logic chain. The flip-flops used in the logic chains are of a special design having two inputs and two outputs. The conventional input and output sequence is from one combinational logic unit to the succeeding combinational logic unit and consists of the normal data path. The second input comes from the preceding rank of flip-flops bypassing the combinational logic units in between and the second distinct output goes to the following rank of flip-flops bypassing the succeeding combinational logic inputs.

Thus, the flip-flops by proper gating may bypass combinational logic units under control so that specific combinational logic units within a chip may be isolated from all other combinational logic units and receive special input operands and have those specific output operands gated as outputs for diagnostic purposes. The multiplex switches at the beginning and ending of each logic chain allow for Special gating of outputs to inputs for serial writing and reading of special operands into the chip and out of the chip. However, not all of the flip-flops on the array need to be of a special design, the actual implementation depends on design requirements. This allows for a flexible trade-off of speed versus easier and more extensive testing. The parallel connection of the special flip-flop ranks allows for an easy and fast testing of a specific portion of the VLSI chip.

In addition to the inventive concepts of the parent application, this Continuation In Part discloses alternate routings for the Test Data Inputs and Test Data Outputs for the specialized flip flops, provides for an initialization input and describes in greater detail flip flop arrangements by which testability of the chip may be enhanced.

IN THE FIGURES:

FIG. 1 is a block diagram of the flexible embedded test system according to the present invention.

FIG. 3 shows the invention of FIG. 1 in the logic analyzer sequence mode.

FIG. 14a is a schematic diagram of a first special flip-flop design for use in the present invention.

FIG. 14b is a truth table for the flip-flop design of FIG. 14a.

FIG. 15a is a schematic diagram of another special flip-flop design for use in the present invention.

FIG. 15b is a truth table for the flip-flop of FIG. 15a.

FIG. 16a is a schematic diagram of yet another special flip-flop design for use in the present invention.

FIG. 16b is a truth table for the flip-flop of FIG. 16a.

Figure 13:
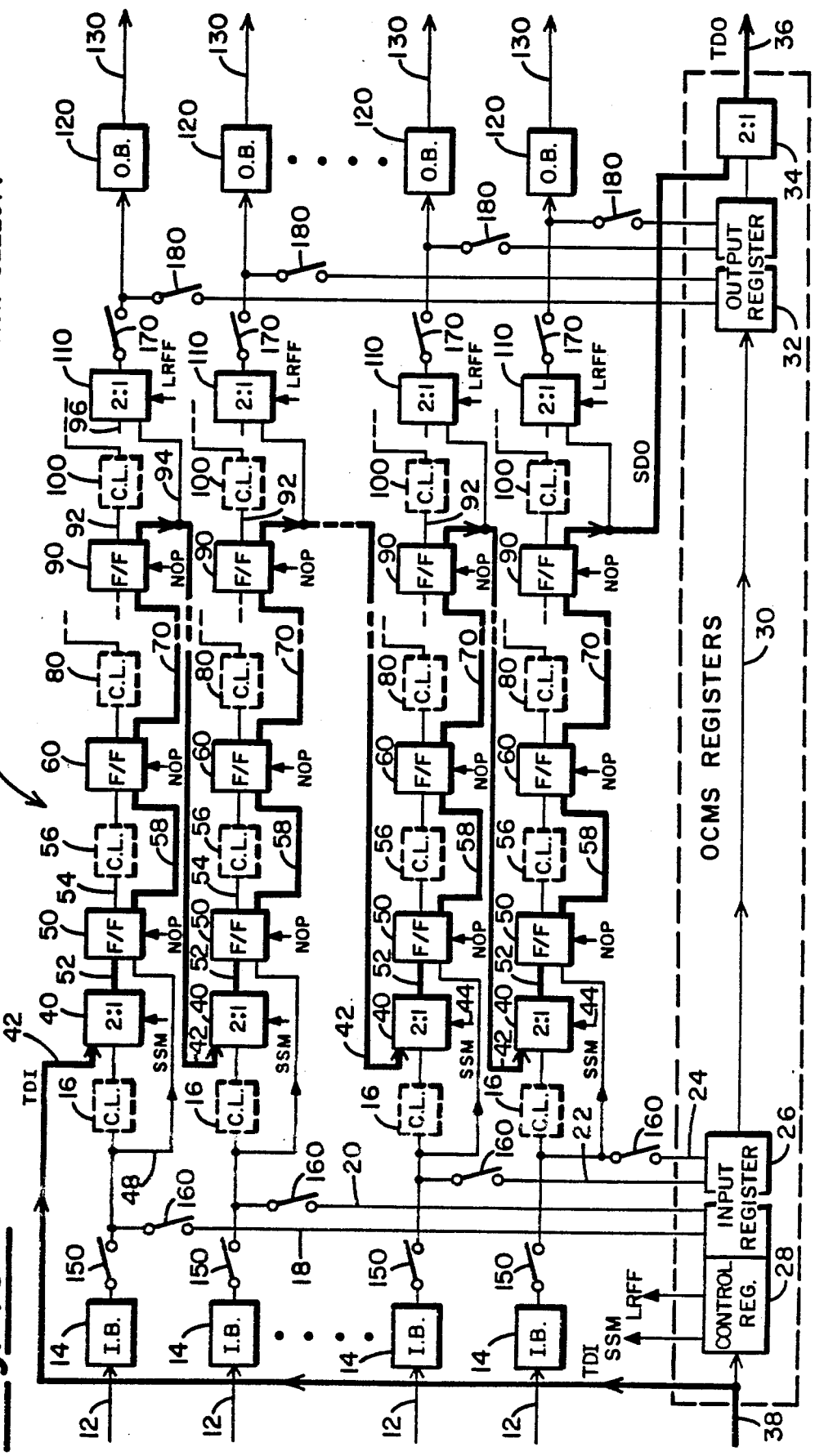
FIG. 13 shows the invention of FIG. 1 in a test mode for a serial data shift into the flip-flop and shift out.
Figure 17:
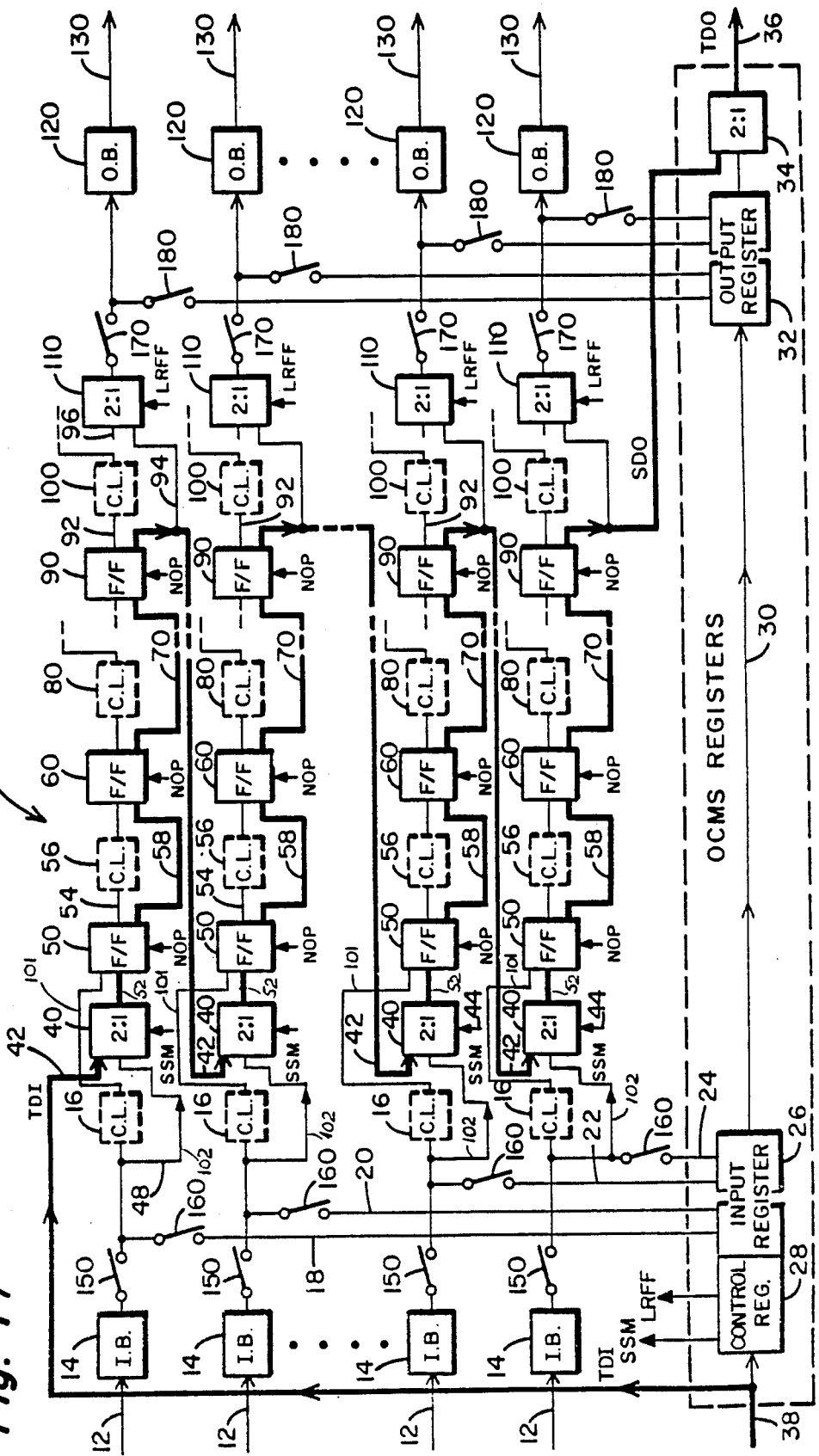

FIG. 17 is a corrected drawing of FIG. 13 which provides new lines 101 and 102 thus providing for rerouting of the inputs to the rank of flip flops 50 and multiplexors 40. In all other respects, it is identical to FIG. 13.

Figure 18:
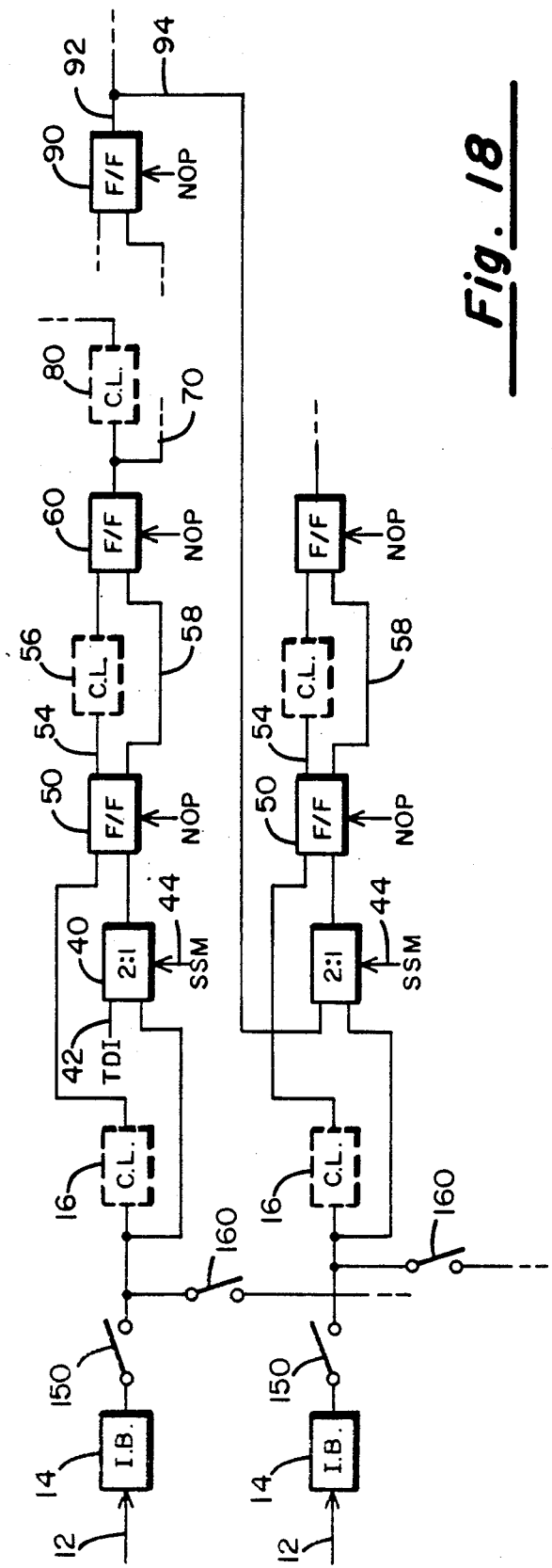

FIG. 18 is a diagram illustrating a slight variation in the output of a rank of flip flops. It is a partial figure, showing the first row of ranks and part of the second which is sufficient to explain the variation.

Figure 19:
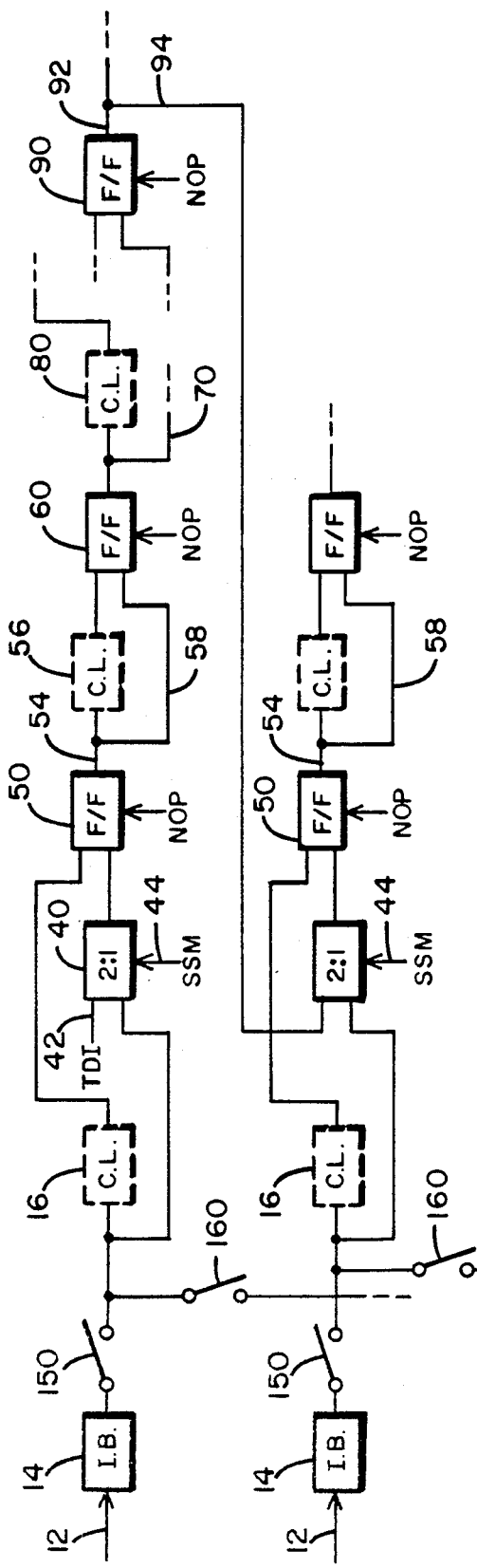

FIG. 19 is a diagram illustrating an extension of the variation flip flop output illustrated in FIG. 18. FIG. 19 is also a partial figure similar in scope to FIG. 18.

Figure 20:
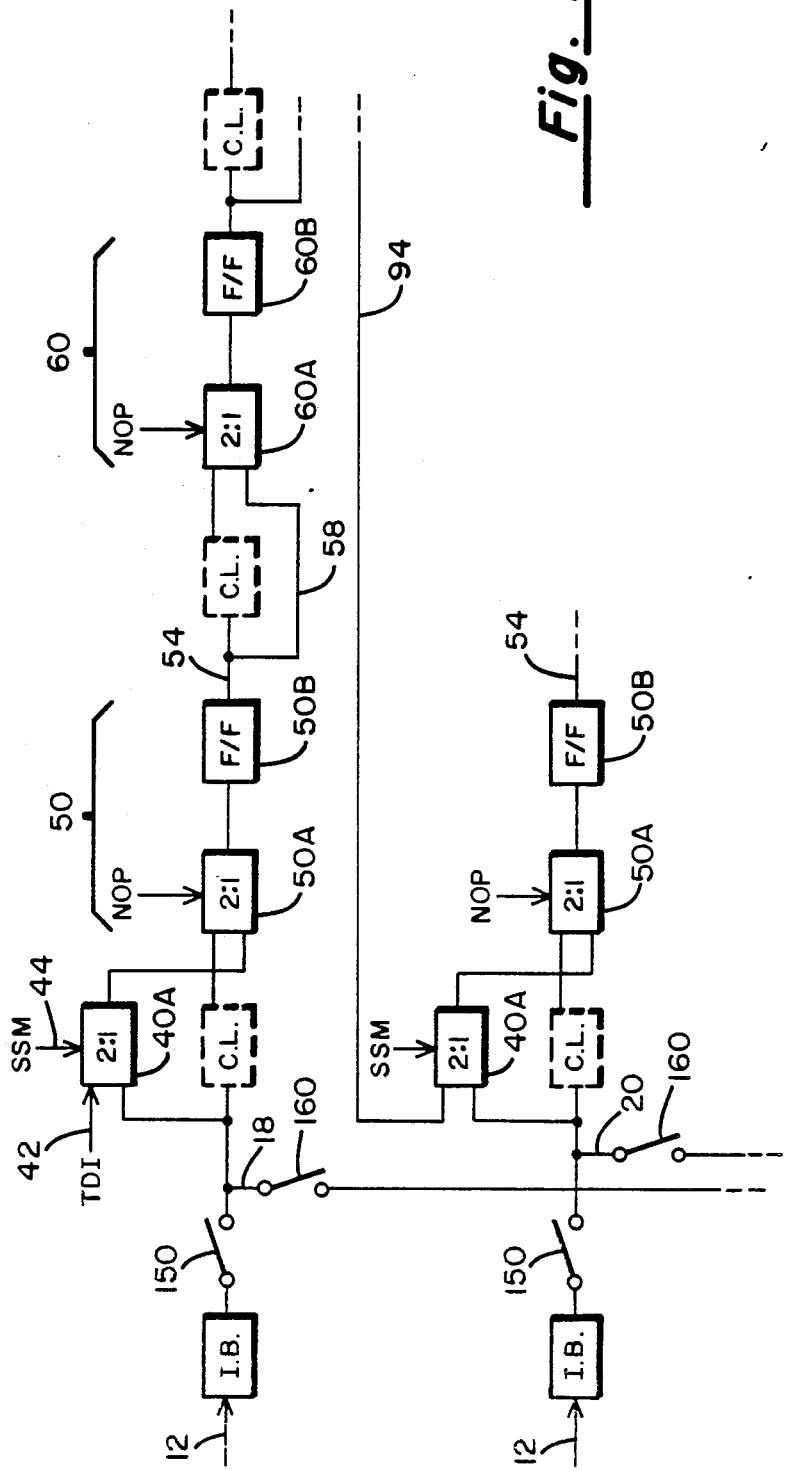

FIG. 20 is a diagram illustrating a change in flip flop structure such that a 2 to 1 multiplexor performs a front-end function for the flip flop. FIG. 20 is also a partial figure of similar scope.

FIG. 21 is a pair of similar diagrams, FIG. 21A and FIG. 21B, illustrating variations in the design of the output buffer.

FIG. 22 is a diagram illustrating the use of a 4 to 1 multiplexor for provision of an initialization function.

FIG. 23 is another diagram illustration including a 4 to 1 multiplexor and a variation in flip flop connection.

Figure 24:
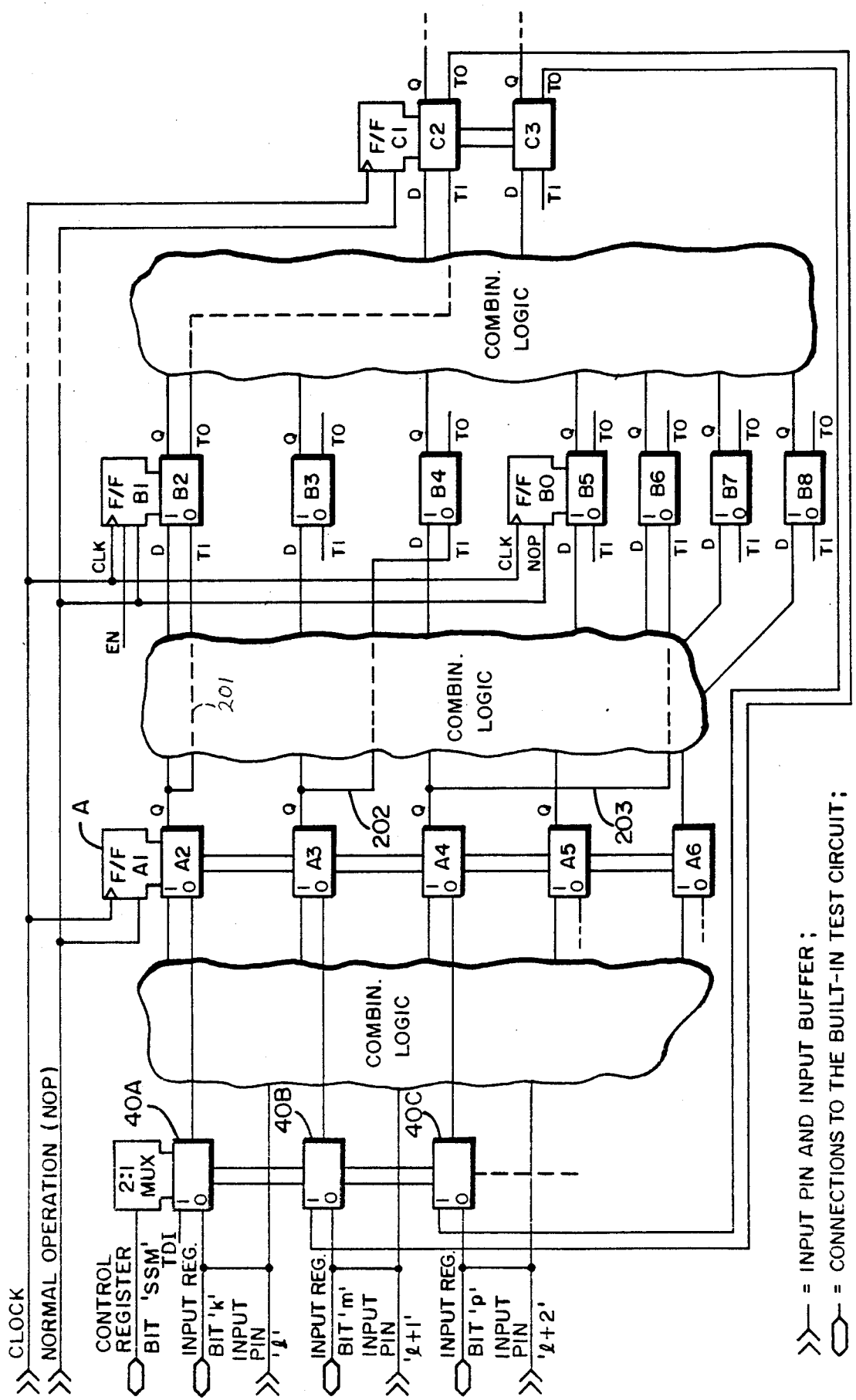

FIG. 24 is a design layout partially illustrating the element arrangement between flip flops and combinational logic on a portion of the VLSI chip in which the invention or its enhancements may be used.

Figure 25:
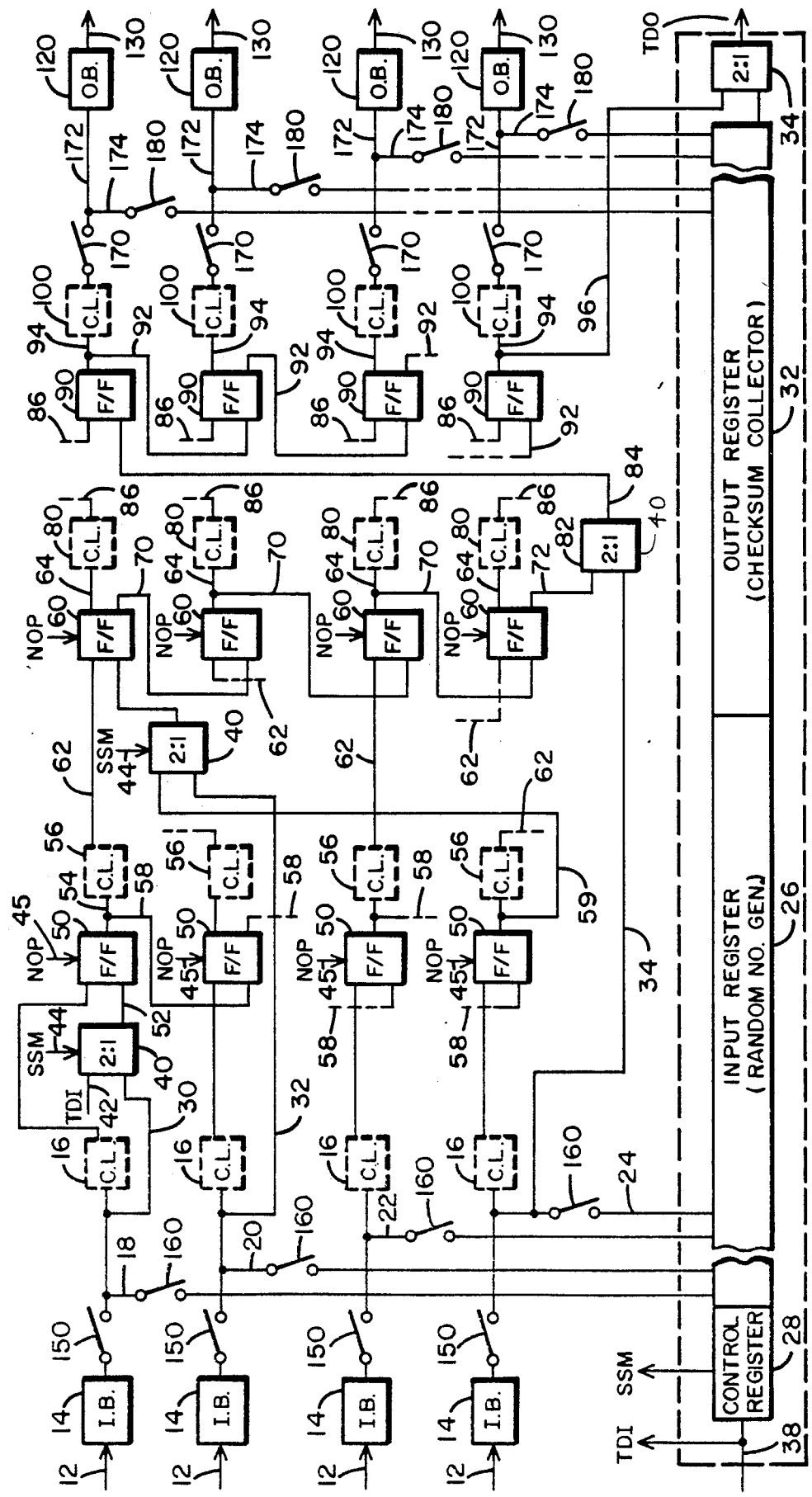

FIG. 25 is a diagram illustrating a variation in the flip flop connection scheme.

Figure 26:
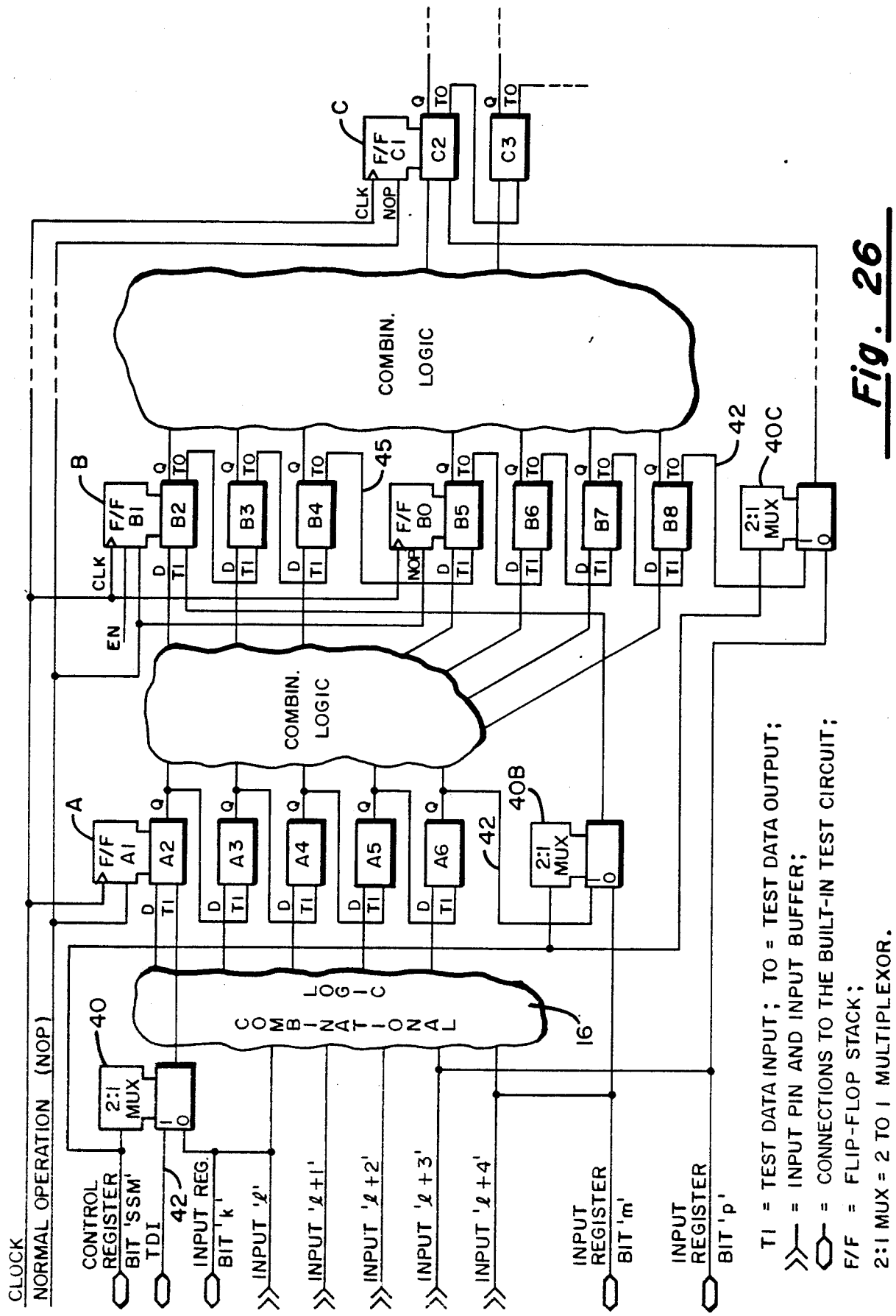

FIG. 26 is a design layout similar to the diagram of FIG. 24 but it illustrates variations in the test data in and test data out connections between flip flops.

All of the above briefly described figures are logical representations of circuit diagrams which are understood by one of ordinary skill in the art.

DESCRIPTION OF THE PREFERRED EMBODIMENTS

Referring to FIG. 1, an embodiment of the present invention 10 is shown on a conventional logic chip. The logic chip has a plurality of input pins 12 each of which is connected with an input buffer 14. The output from each input buffer is switchably connected to a combinational logic unit 16 of some sort as required for operation of the intended purpose of the logic chip. In addition, each input buffer has a separate switchable connection 18, 20, 22, 24 and so forth to a separate bit of an input register 26 which is part of the on-chip maintenance system as described in U.S. Pat. No. 4,357,703. The input register 26 and control register 28 have the capability of generating pseudorandom numbers and of sending and receiving data in serial or parallel form. Input register 26 is connected by a data path 30 to a similar output register 32. The contents of output register 32 are connected through a two-to-one multiplex gate 34 to the test data output pin 36. The test data input pin is provided at 38.

The output of each similar combinational logic unit 16 is connected to a rank of multiplex data switches 40. Each multiplex data switch 40 receives a test data input 42 which is from another portion of the logic chip as will be described. Each multiplex switch 40 has a control input line 44 to control whether the standard data path is used or a serial scan mode data path is used which transfers in the test data.

Each of the two-to-one multiplex switches is connected to a first rank of special flip-flops 50 having two distinct inputs and two distinct outputs. The standard mode of operation of the flip-flop rank is to have the normal operating data from the multiplex switch 40 be connected through the normal input path 52 through the flip-flop to the normal output path 54 to the next combinational logic element 56. Two modes of test data may be implemented, one in which the output data passes through the test data path 58 which bypasses the combinational logic unit 56 and is gated to the test data input of the next rank of flip-flops 60. The other data path is the standard logic data path 54 which is connected to the combinational logic units 56. The logic output of combinational logic units 56 passes through a conventional logic data path 62 to the flip-flop rank 60.

Similarly, flip-flop rank 60 is connected directly to combinational logic units 80 which in turn are connected to yet another flip-flop rank 90. Flip-flop rank 60 is also connected through data path 70 directly to flip-flop rank 90. Thus, the scheme of connection for test purposes is that each flip-flop rank is connected directly to the succeeding flip-flop rank so that no logic processing operation occurs in the combinational logic unit and unchanged operands are passed within the chip. However, for normal operation, data is passed through the combinational logic units and the flip-flop rank for the required logic operations.

Finally, flip-flop rank 90 is connected directly to combinational logic units 100. Flip-flops 90 are also connected through a bypass data path 94 to two-to-one multiplex switches 110. Flip-flop rank 90 has a conventional data path 92 to combinational logic unit 100 which in turn has a conventional data path 96 output to multiplex switch 10. The flip-flop test data bypass connection 94 between flip-flop rank 90 and the multiplex switch 110 also includes a data path 42 which is connected back as an input to the first rank of two-to-one multiplex switches for use in the serial scan test mode.

Finally, the output of the final multiplex switch 110 is switchably connected to a rank of output buffers 120. The output biffers all receive data either from output register 32 of the maintenance and diagnostic system or from the two-to-one multiplex switch output 110. Finally, the output of output buffers 120 is connected to output pins 130 to provide the data output for the chip.

Switches 150, 160, 170 and 180 are controlled by control register 28 and form part of the control system of the on-chip maintenance system shown in Pat. No. 4,357,703. These switches control the data path in normal parallel in and out mode and allow registers 26 and 32 to provide serial data shifts.

Referring now to FIG. 2, an initialization sequence is shown for an array having five flip-flop ranks and in which there are different numbers of flip-flops in the different ranks. Also, some flip-flop ranks skip one or two possible logic levels so that data passes more rapidly in one chain than another. Note for example that some flip-flops in rank 2 are connected directly to ranks 4 or 5. The different cross-hatch patterns show a level of logic as it is clocked through the flip-flops. This sequence shows that, even if some of the flip-flop ranks have fewer flip-flops than other ranks, the content of every flip-flop on the chip is defined after a number of clocks equal the number of flip-flop ranks.

FIG. 3 shows the logic analyzer sequence which is similar to the standard operation of the maintenance and test system as shown in Pat. No. 4,357,703 in which input data is provided through the input pins and input buffers and connected into the test data input register 26. Register 26 is connected through data path 30 to the output register 32 as well as to the input of the output buffer rank 120. Output buffers 120 are connected to output register 32 and hence to output pin 36 to insure that the input/output value of the chip functions can be monitored during normal chip activity. In this mode, the SSM, NOP and LRFF values are set to 1.

Figure 2A:
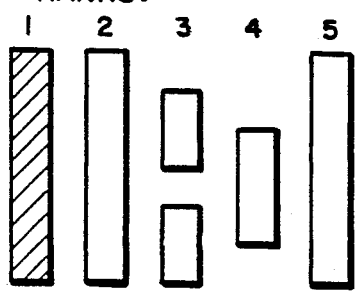
FIG. 2 is a schematic diagram of an initialization sequence for a logic array using a parallel-serial design to show full definition of the contents of all logic chip ranks according to the present invention. Its parts designated 2a-e snow sequence order.
Figure 2B:
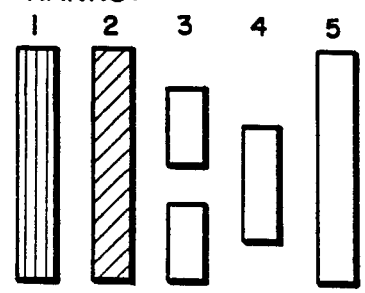
Figure 2C:
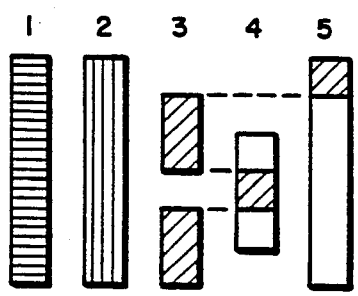
Figure 2D:
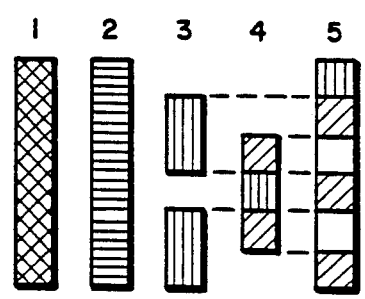
Figure 2E:
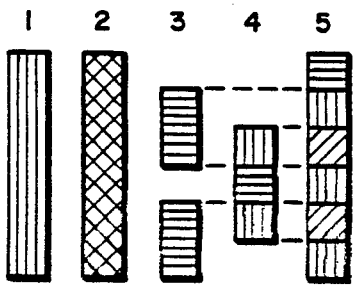
Figure 4:
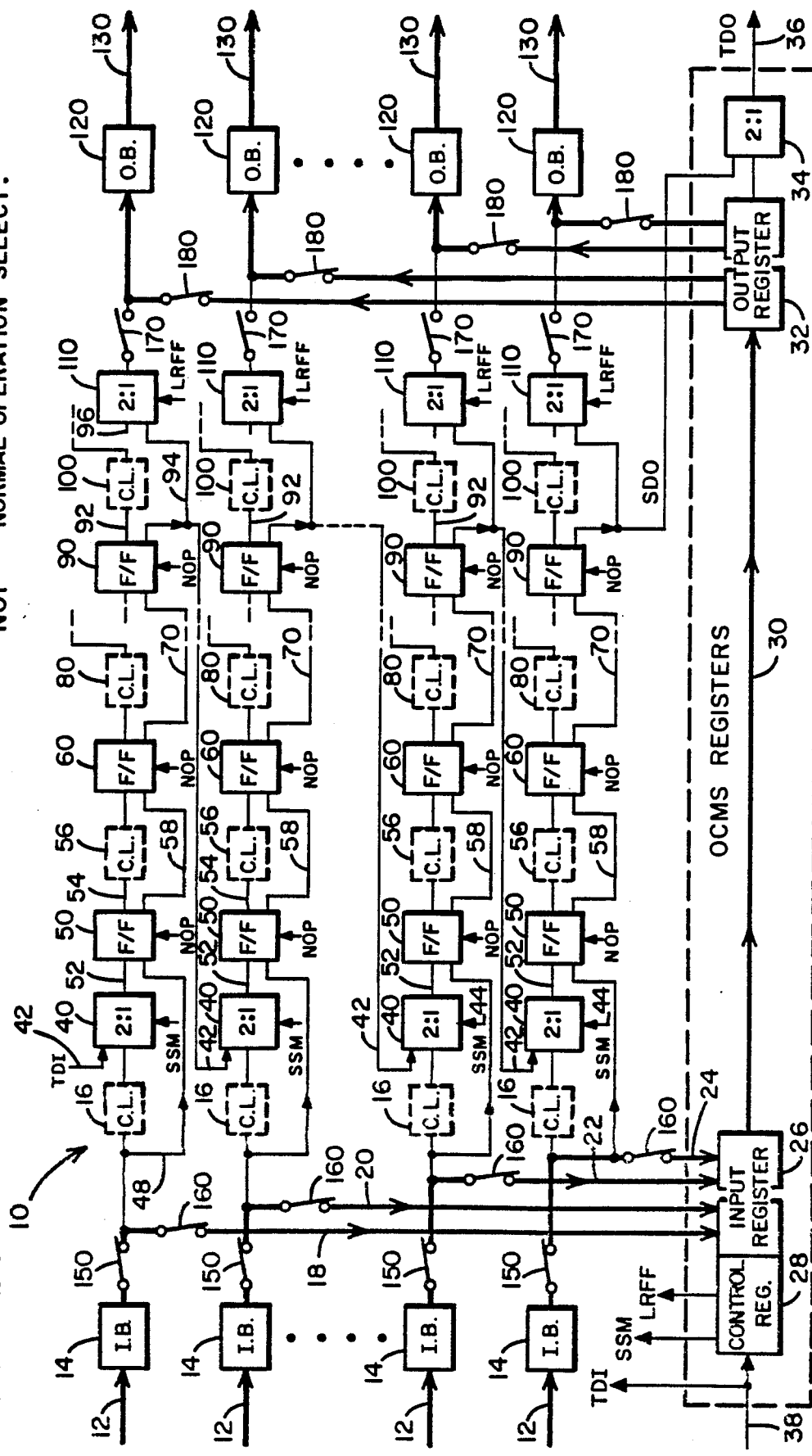
FIG. 4 shows the invention of FIG. 1 in the chip interconnect test mode.

FIG. 4 shows a basic chip interconnect test sequence. The SSM, NOP and LRFF values are set to 1.

Figure 5:
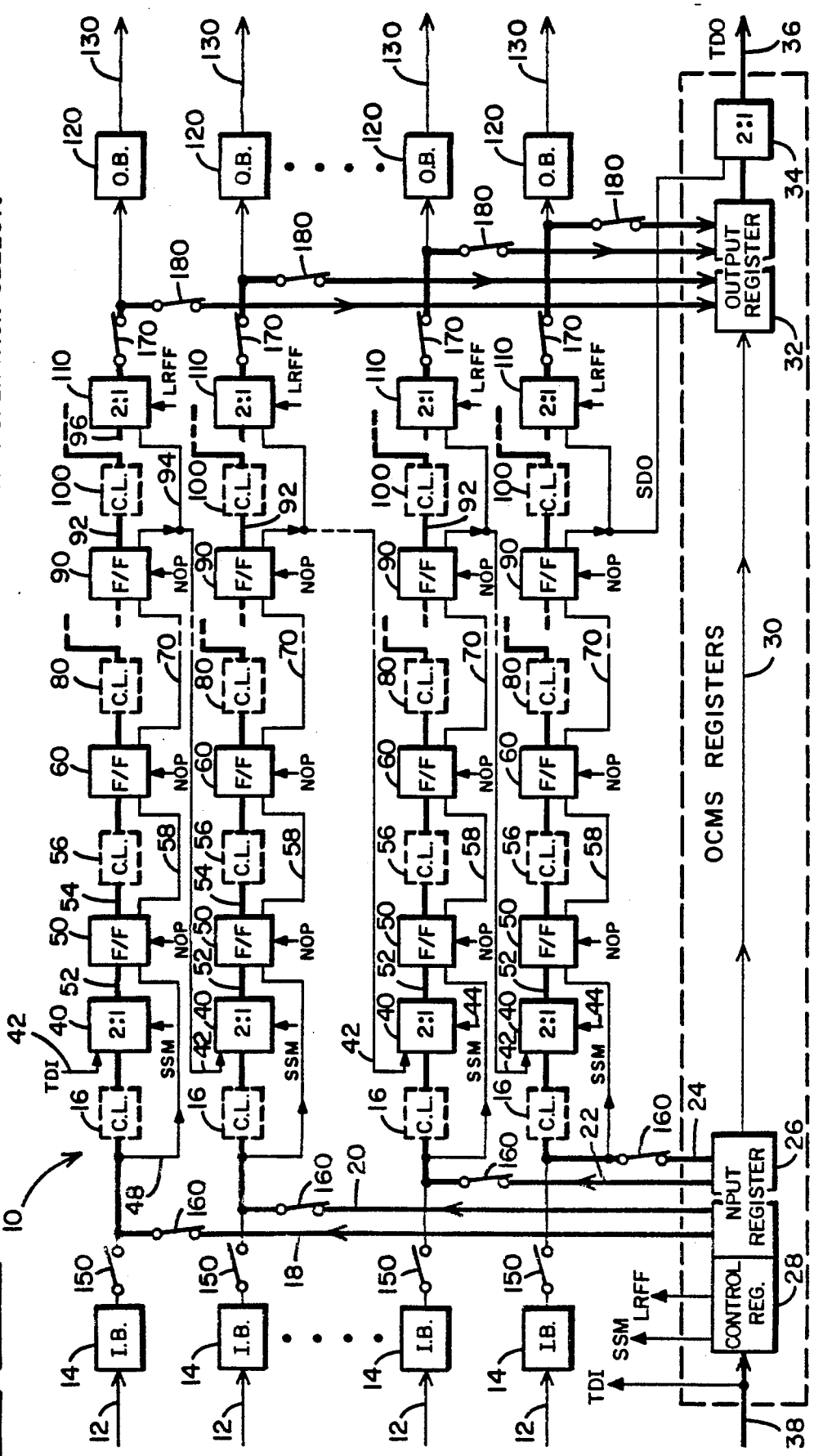
FIG. 5 shows the invention of FIG. 1 in the static chip test mode.

FIG. 5 shows a static chip test in which input data is provided to the input test register 26 and passed through all of the combinational logic and flip-flop ranks of the chip in normal operating mode and connected through the output register 32 to the test data output pin 36. This test sequence determines if all the logic in the chip is operating in a normal fashion independently of input and output pins and input and output buffers and is thus a pure test of the logic in the chip separate and apart from input and output transients. Again this function is similar to that shown in Pat. No. 4,357,703.

Figure 6:
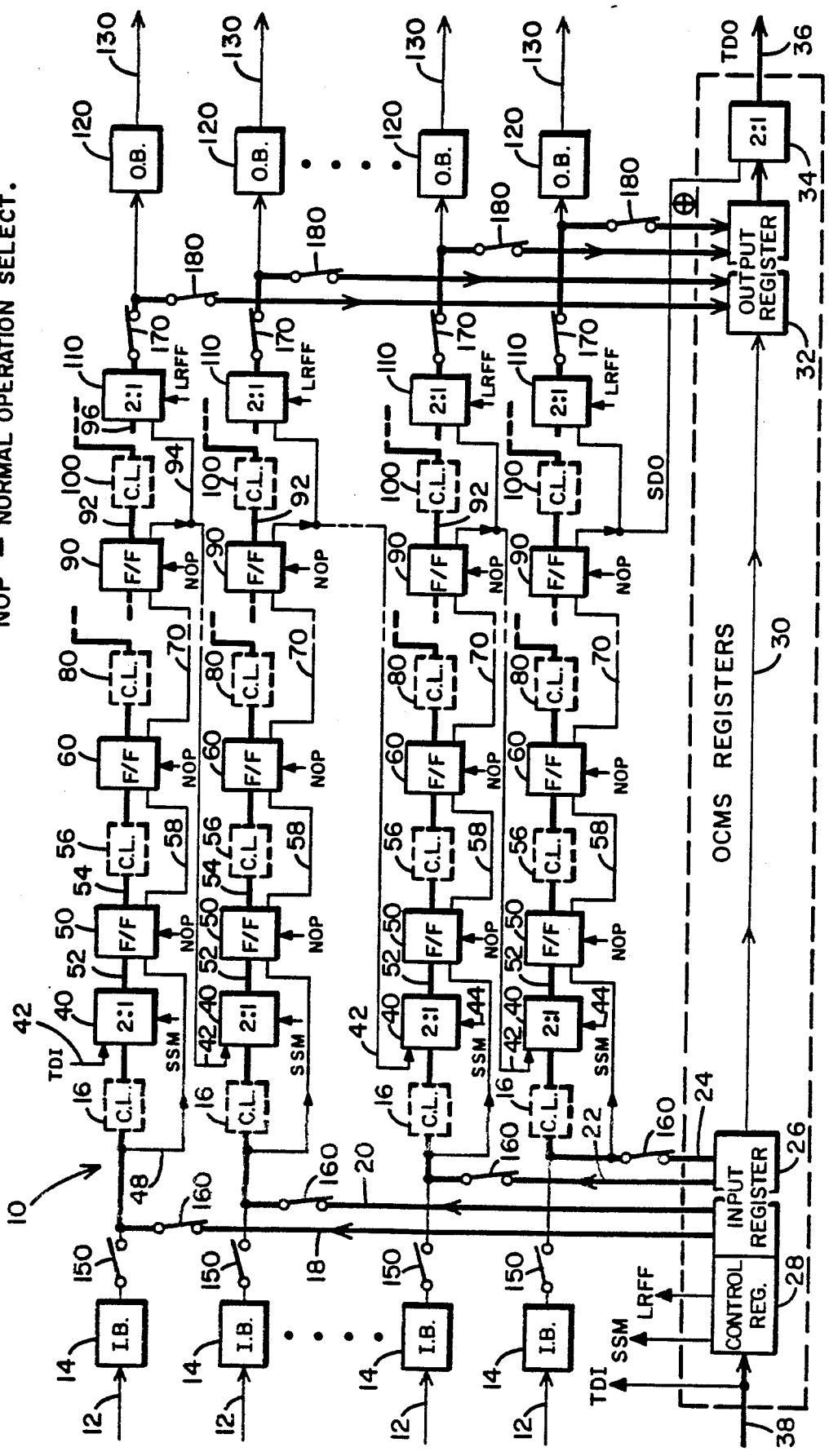
FIG. 6 shows the invention of FIG. 1 in the dynamic signature analysis test mode.

FIG. 6 shows a similar test to that shown in FIG. 5. The input test register 26 produces a pseudorandom input data system and the output register 32 is check-summing the results. This sequence is a dynamic signature analysis function.

Figure 7:
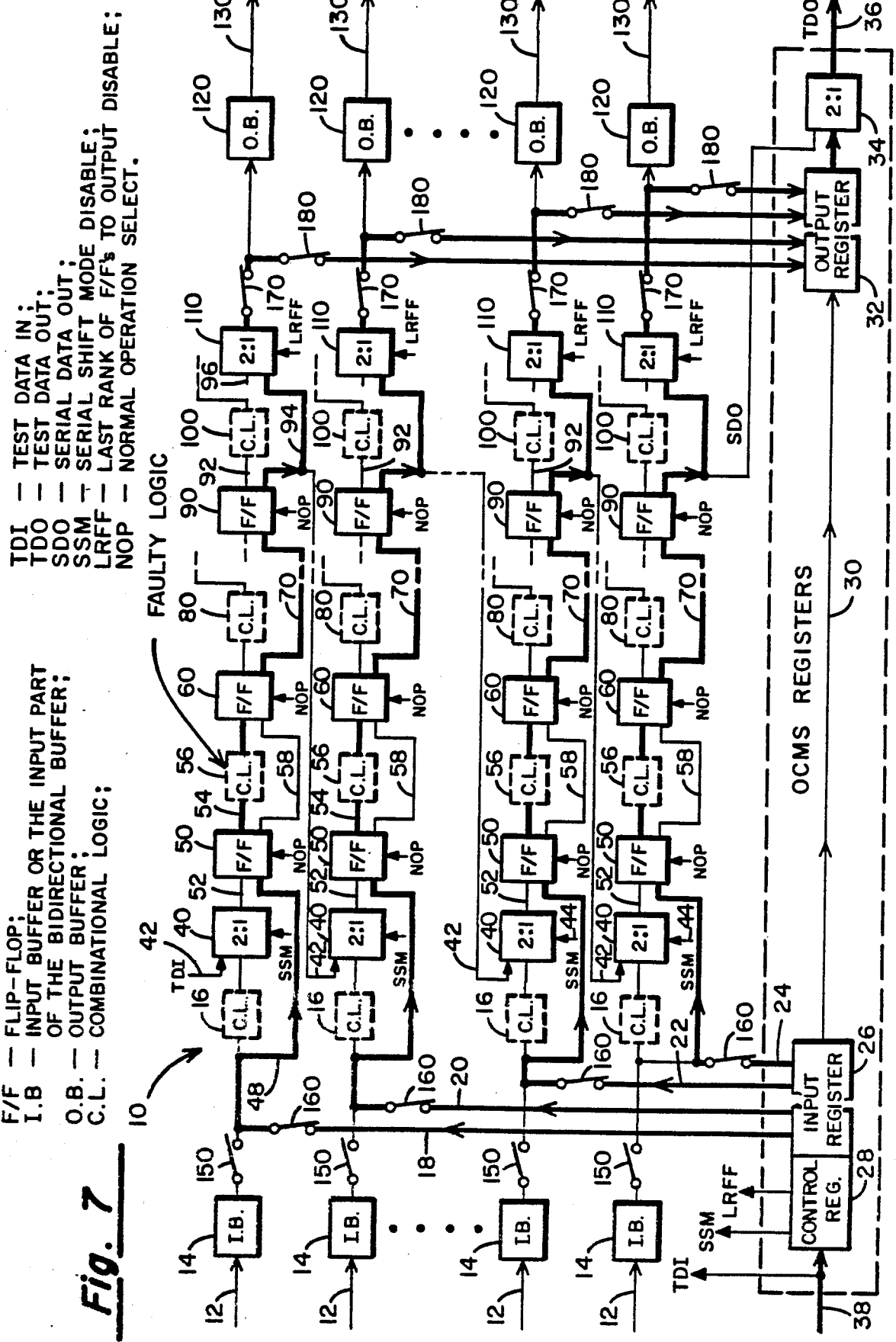
FIG. 7 shows the invention of FIG. 1 in the design fault detection mode for an error located between two flip-flop ranks.

FIG. 7 shows a test in which the test data input register 26 provides data to the conventional logic paths in the chip. However, the flip-flop rank 50 is adjusted to take inputs from the test data input path 48 thereby bypassing combinational logic rank 16. The output of flip-flop rank 44 is connected to combinational logic rank 56 which is to be tested to determine if it is faulty. The output flip-flop rank from combinational logic rank 56 is flip-flop rank 60 which is selected to pass its output down the test data path through other flip-flop ranks such as flip-flop rank 90, bypassing other combinational logic ranks in the unit such as rank 80 so that the output is connected directly through the two-to-one multiplex buffer rank 110 into the output register 32. Thus the input pins, the input buffers, the output buffers and output pins are isolated out of the test. By proper selection of the gating of the flip-flop ranks 50, 60, 90 and the multiplex switches 40 and 110 the data passes only through combinational logic rank 56. The SSM value is 1. The NOP value is set at 0 initially, then 1 for one clock period, then 0 for the rest of the test. The LRFF value is 0. Thus, a pure test of combinational logic rank 50 is provided between data flowing from input register 26 to output register 32 and through the test data output pin 36.

Figure 8:
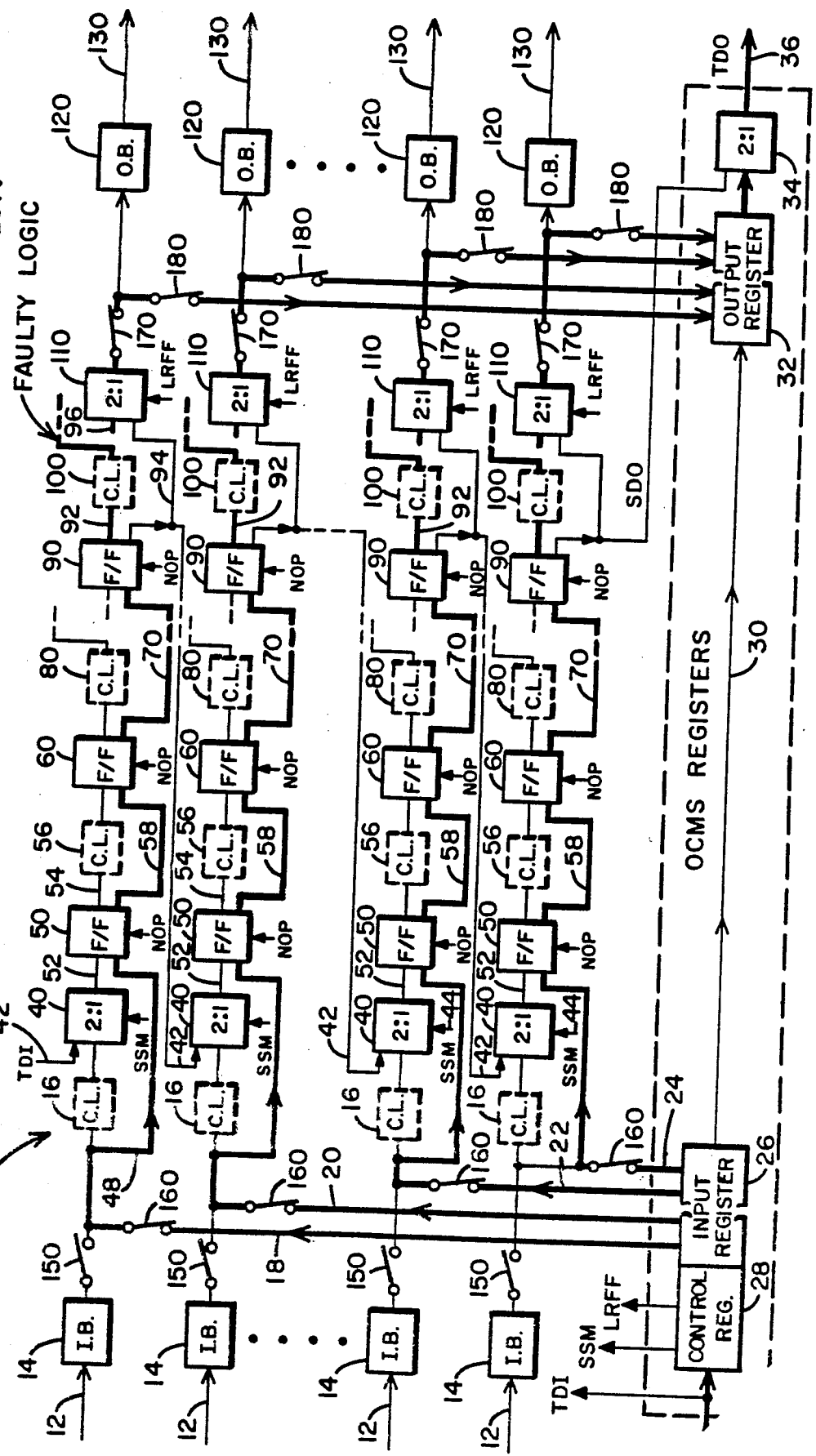
FIG. 8 shows the invention of FIG. 1 in the design fault detection mode for an error located between the last flip-flop rank and the output register.

FIG. 8 shows a similar test sequence where the presumed faulty logic rank is combinational logic rank 100 and the data bypasses the other combinational logic ranks of the system so that the only data operation is performed in combinational logic rank 100.

Figure 9:
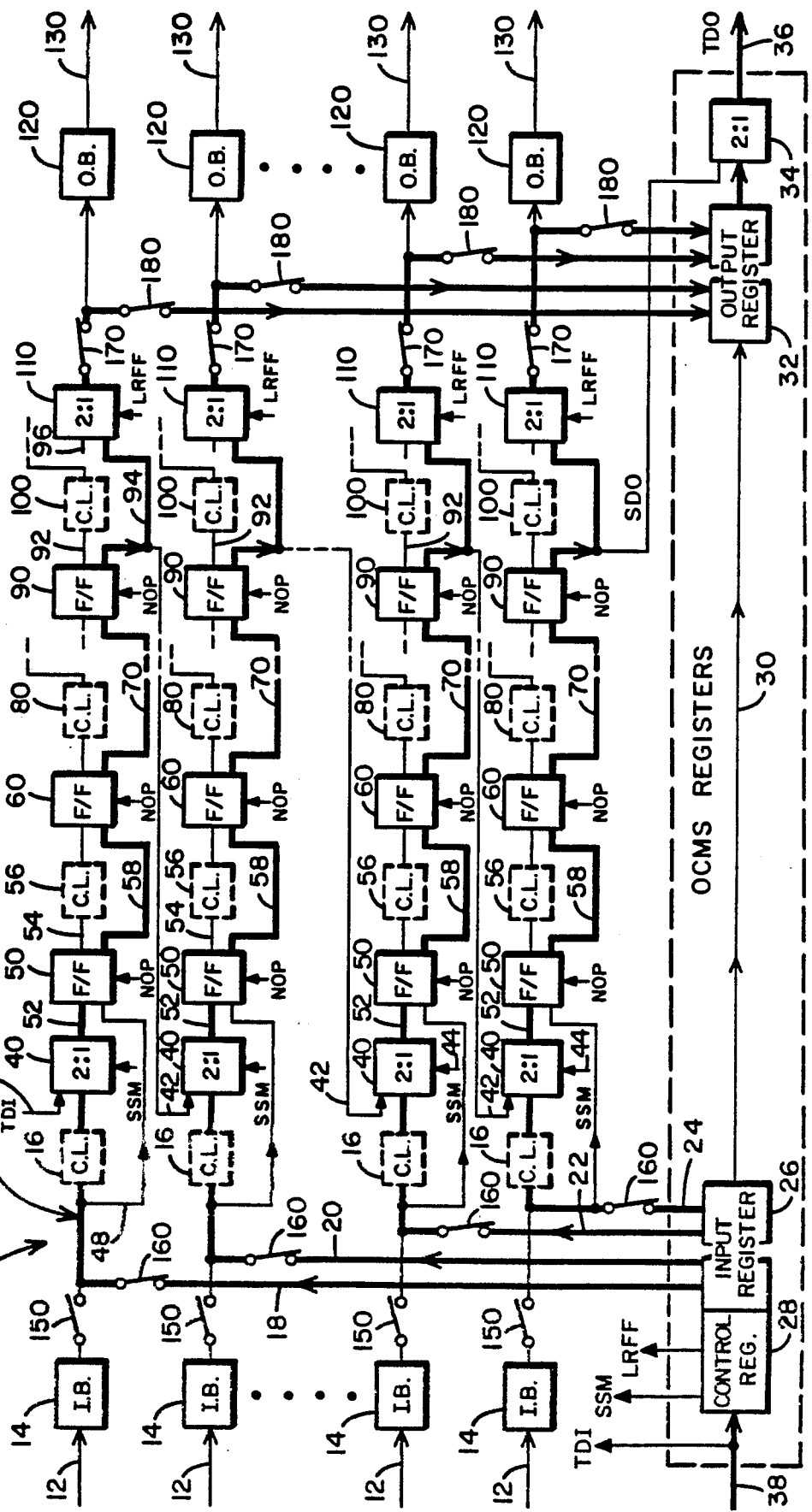
FIG. 9 shows the invention of FIG. 1 in the design fault detection mode for an error located between an input buffer and the first flip-flop rank.

Following a similar pattern, FIG. 9 shows a test in which the only combinational logic rank which has data passing through it is rank 16 and flip-flops 50, 60, 90 and multiplex switches 40 and 110 are set to connect data from the input register 26 to the output register 32 so as to bypass all other combinational logic ranks. The SSM value is 1 and the LRFF value is 0. The NOP value is set to 1 for one clock and then set to 0 for the rest of the test.

Figure 10:
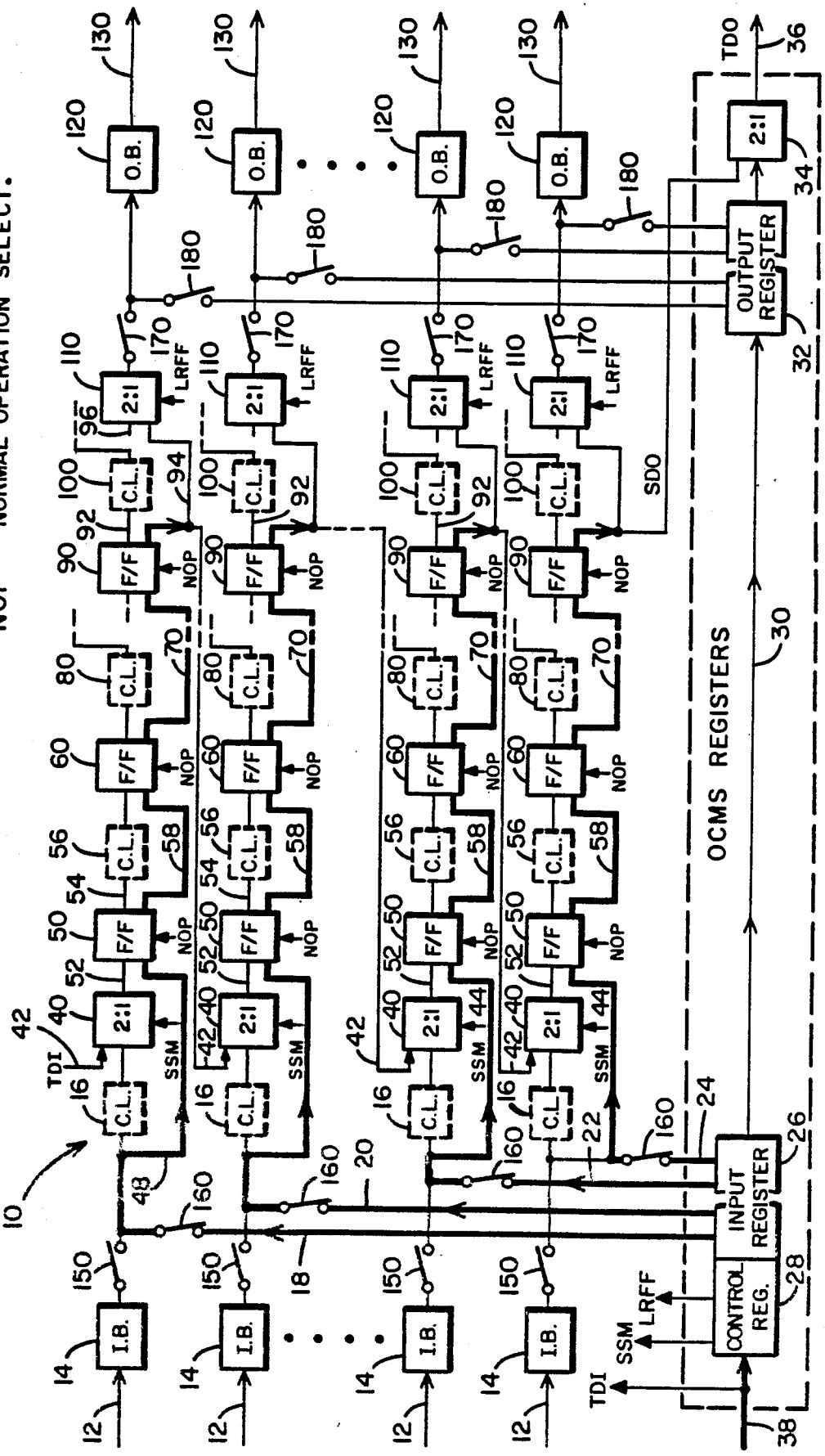
FIG. 10 shows the invention of FIG. 1 in a test mode forcing every flip-flop on the chip to a pseudorandom value.

FIG. 10 shows the case in which all combinational logic units are bypassed so that test data from register 26 can be passed sequentially to all flip-flop ranks 50, 60 and 90 to set the condition of all flip-flops to be a predetermined condition. The SSM value is 1 while the NOP value is 0.

Figure 11:
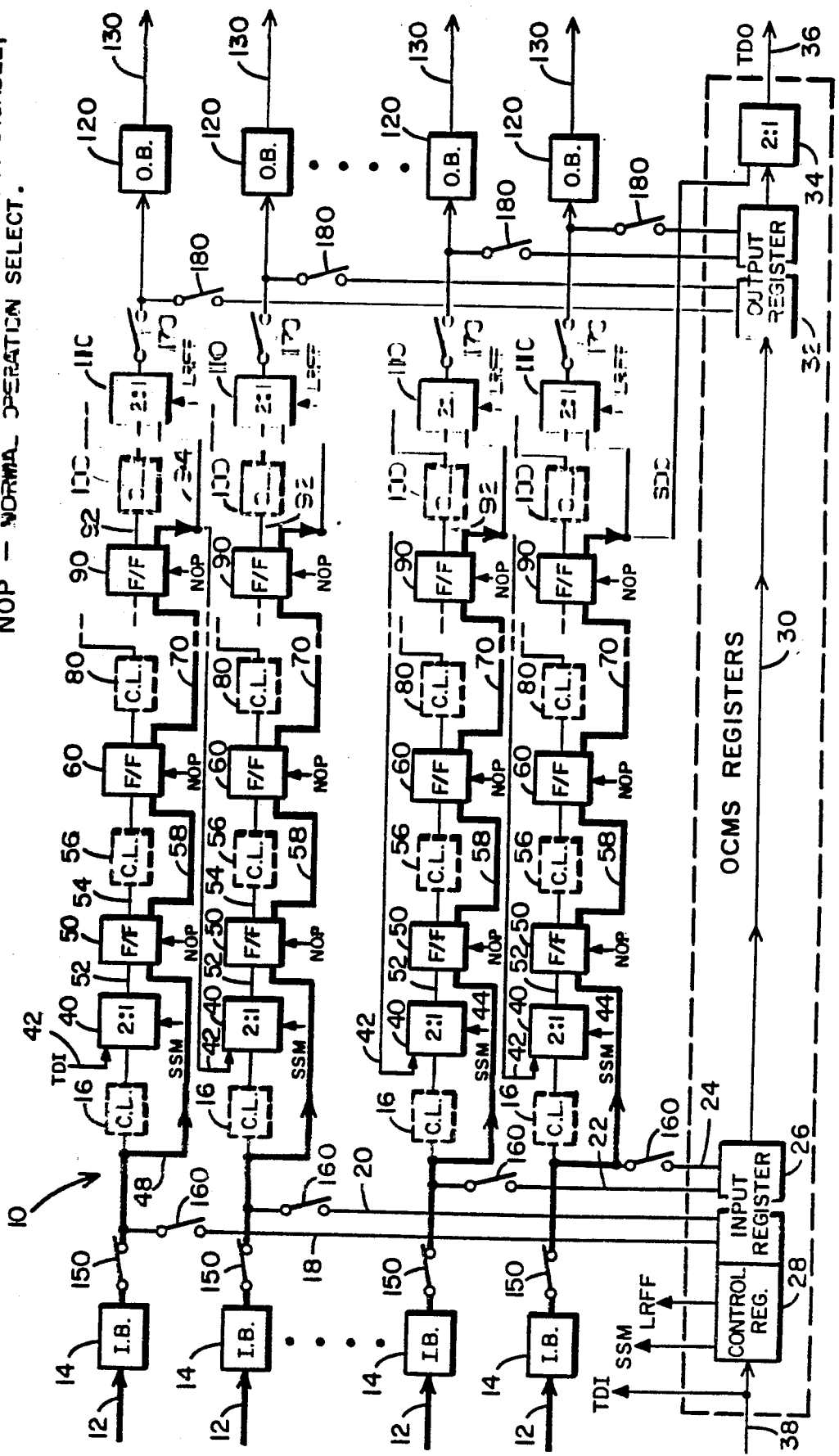
FIG. 11 shows the invention of FIG. 1 in a test mode forcing every flip-flop on a chip to a predetermined value using the input pins.

FIG. 11 shows the same condition of forcing every flip-flop on a chip to be a predetermined value but using the conventional data input pins 12 rather than the test data input register 26 to provide the data path.

Figure 12:
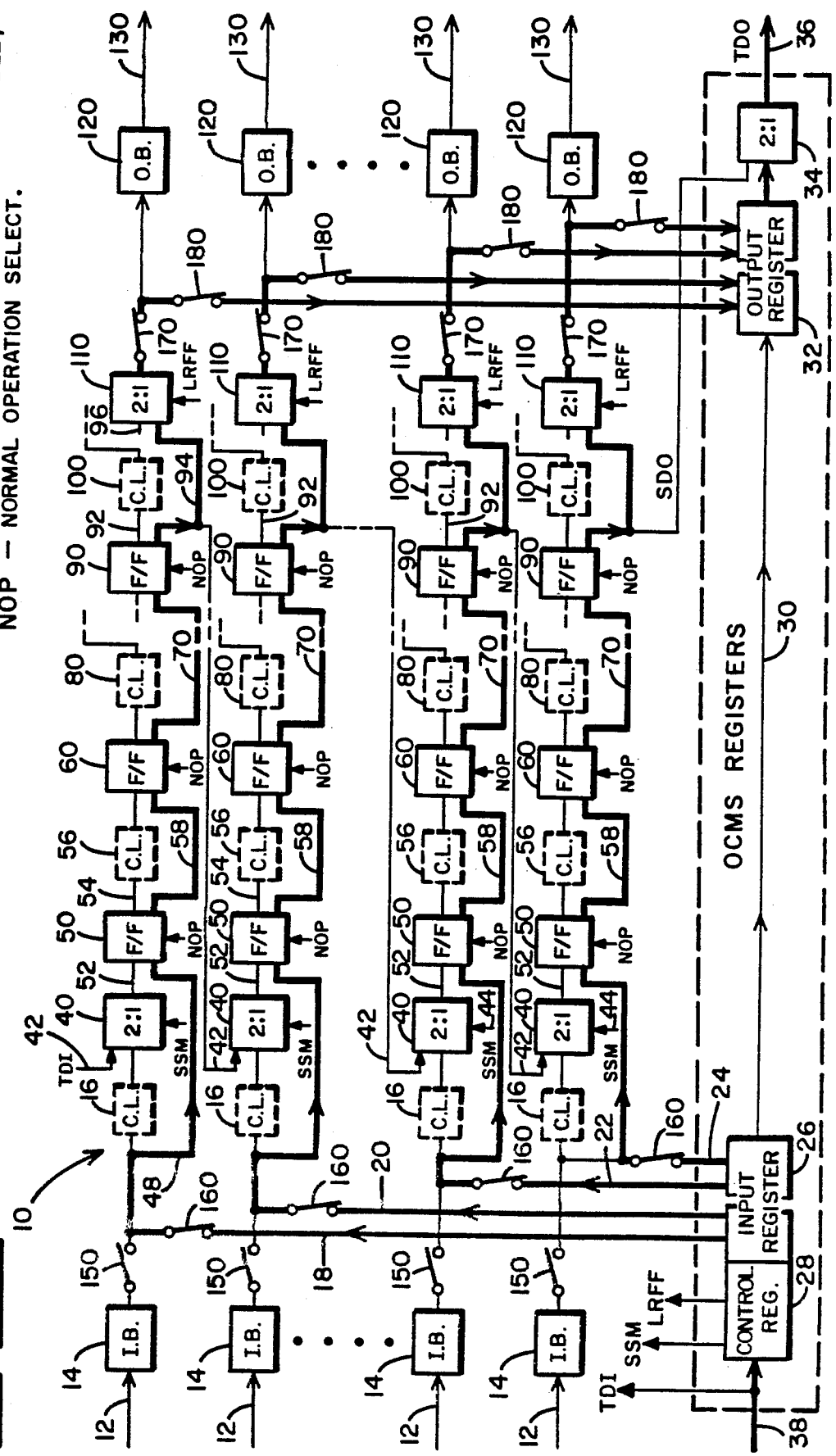
FIG. 12 shows the invention of FIG. 1 in a test mode for flip-flop integrity checking.

FIG. 12 shows the situation in which the flip-flops only are tested for integrity and in which no combinational logic units are employed on the chip so that all data flows only through the flip-flops on the chip and not through any of the combinational logic units or the multiplex switch system. The SSM value is 1 while the NOP and LRFF values are 0.

Finally, FIG. 13 shows the situation in which the multiplex switches 40 and 110 are set for a scan pattern function with all of the flip-flops so that data may be scanned serially through the entire chip starting from the test data input 38 through first multiplex switch sequentially through all of the flip-flops 50, 60 and 90 in the first logic path and then sequentially through all of the flip-flops and out through the test data output pin. The SSM and NOP values are set to 0.

Figures 14A, 14B:
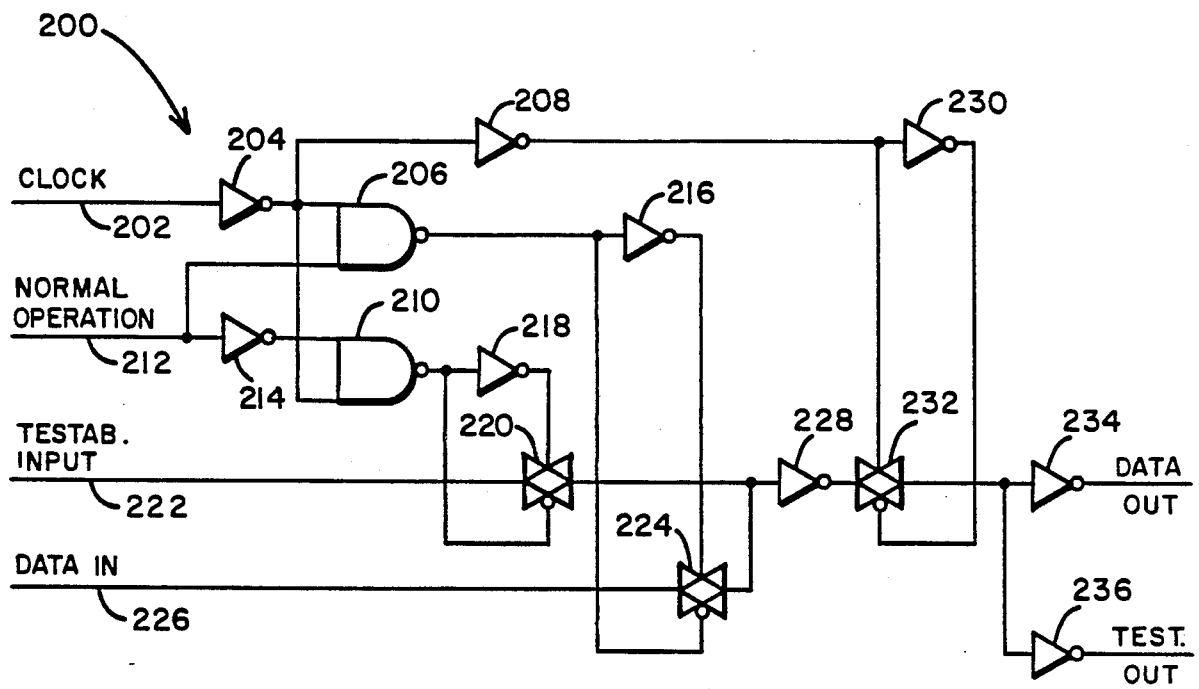
Figures 15A, 15B:
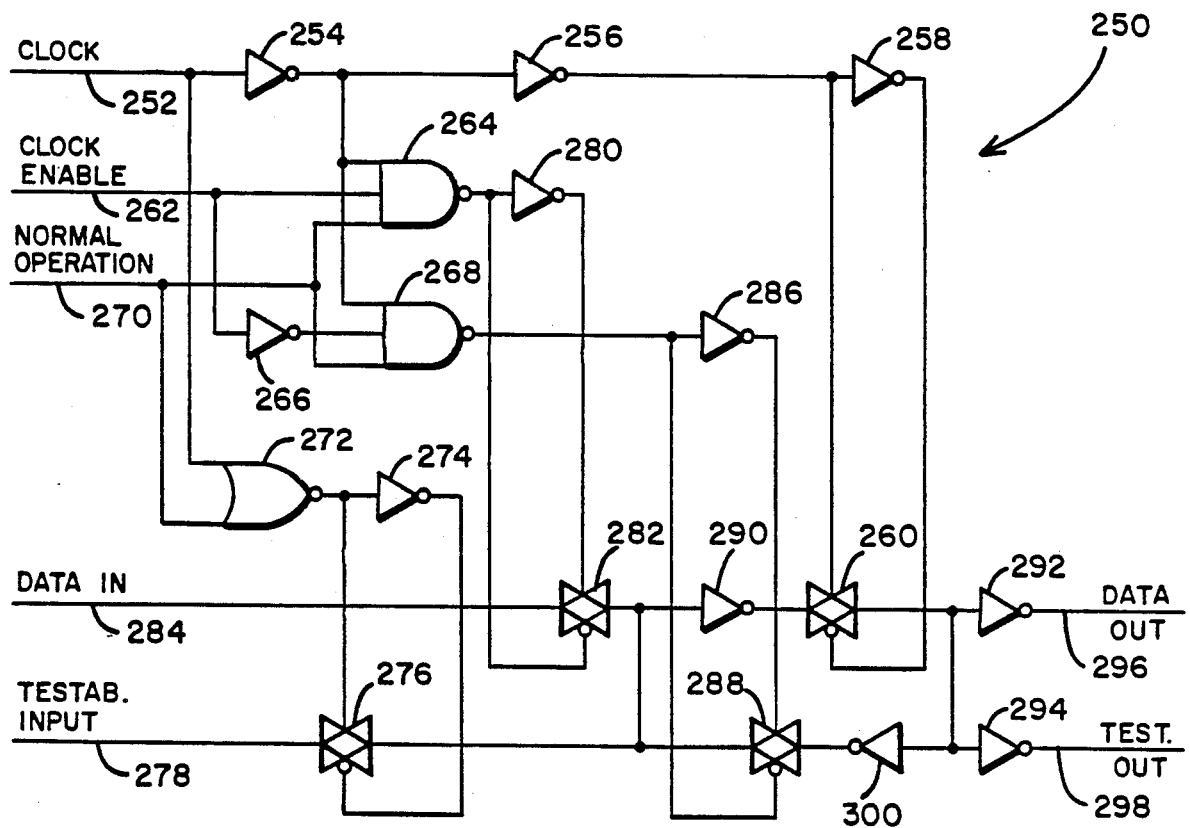
Figures 16A, 16B:
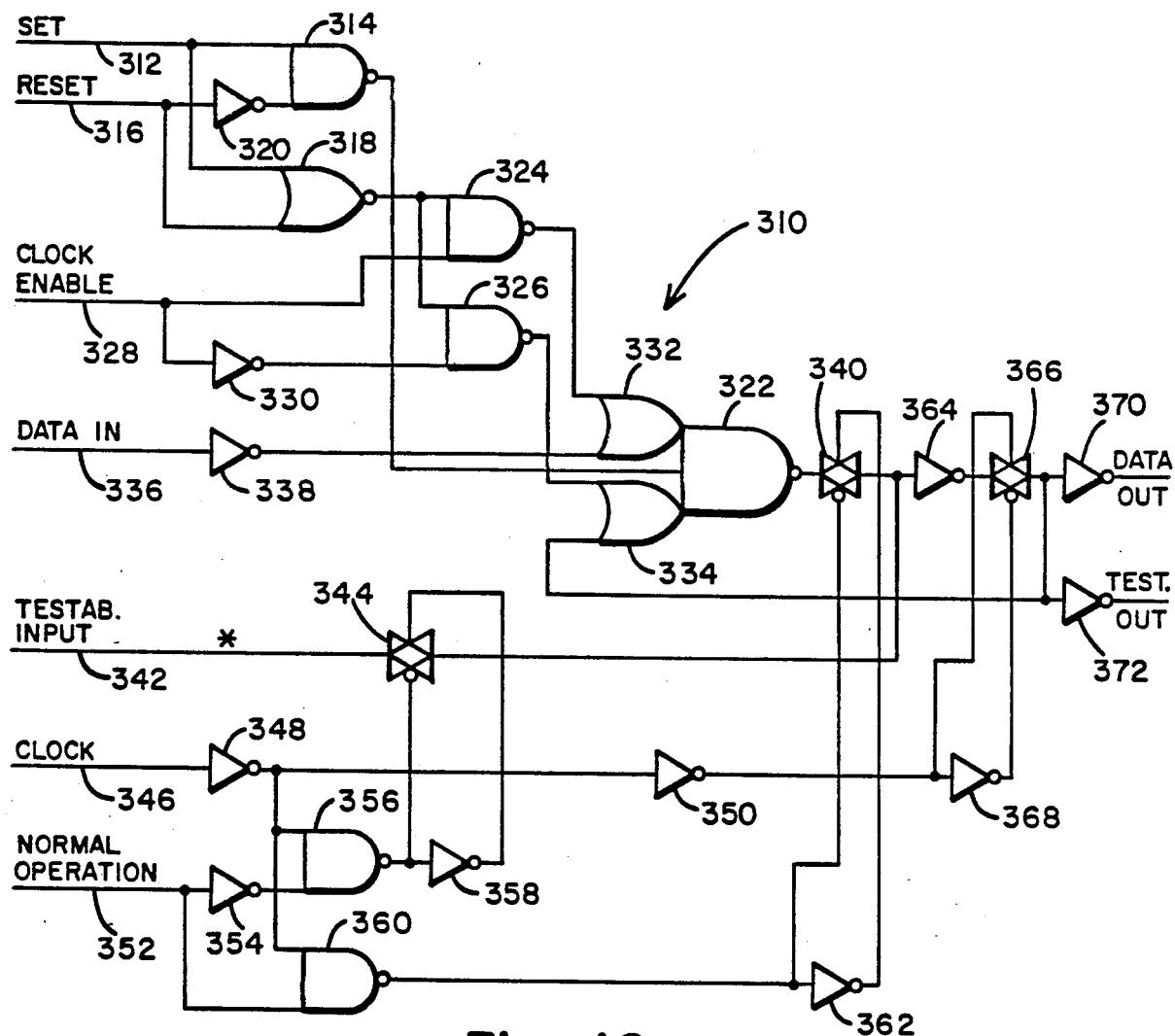

FIGS. 14a, 15a and 16a show flip-flops for use in connection with the present invention having an increased degree of complexity and controllability depending on the needs of the designer. One of the advantages of the present invention is it may be used in connection with any one of a number of different types of flip-flops in the various flip-flop ranks, or it may be used with several different types of flip-flops in the different flip-flop ranks.

Referring now to FIG. 14a, the flip-flop 200 has a clock input 202 to an inverter 204 which is connected as one of the inputs to an AND gate 206. The output of inverter 204 is also connected to inverter 208 and AND gate 210. The flip-flop has a normal operation (NOP) input 212 which is connected with inverter 214 and provides the second input to AND gate 206. The output of inverter 214 provides the second input to AND gate 210. The outputs of AND gates 206 and 210 are both inverted and connected to inverting drivers 216 and 218, respectively. Drivers 216 and 218 each drive transmission gates of a standard P-N junction type, also commonly referred to as T-gates. T-gates are specific to CMOS technology but this invention is not limited to CMOS technology and may be implemented in other ways. CMOS technology is a convenient reference point for explaining this embodiment of the invention.

Inverter driver 218 controls T-gate 220 which is connected in the testability input 222 to the flip-flop. Inverter driver 216 controls T-gate 224 which is in the data input 226 to the flip-flop. The outputs of T-gates 220 and 224 are connected to the input to inverter 228. The design of the flip-flop is such that T-gates 220 and 224 will not be on at the same time. The output of inverter 208 is connected to inverter driver 230 which drives T-gate 232 in the output of inverter 228. The output of T-gate 232 is connected to inverters 234 and 236 to provide isolation in the output. Inverter 234 provides the data output of the flip-flop, while inverter 236 provides the testability output of the flip-flop.

FIG. 14b provides a truth table for the flip-flop. The normal operation input is shown together with the clock, data in and testability inputs as related to the output. As can be seen from the schematic diagram, both the data output and the testability output are the same. In the truth table, the symbol "X" refers to a "does not matter condition" and the symbol "Q" refers to a "remains in the same condition as before" output. The "Q" output means that a previous binary 0 output remains at binary 0, and a previous binary 1 output remains at 1.

Referring now to FIG. 15a, a more complicated flip-flop 250 is shown which has an additional clock enable input not shown in the flip-flop of FIG. 14a. Flip-flop 250 has a clock input 252 connected to an inverter 254 the output of which is connected to inverter 256. The output of inverter 256 is connected with inverter driver 258 which controls T-gate 260. The clock enable input 262 is connected as one input to AND gate 264 and to inverter 266. The output of inverter 266 provides one input to AND gate 268. The output of inverter 254, previously mentioned, provides a second input to both AND gates 264 and 268. The normal operation input 270 is connected to provide a third input to both AND gates 264 and 268. The normal operation input is also connected as one input to OR gate 272. The second input to OR gate 272 is the clock input 252. The OR gate output is inverted and controls inverter driver 274 which drives T-gate 276. T-gate 276 is in the testability input line 278. The output of AND gate 264 controls inverter driver 280 which controls T-gate 282 which is in the data input line 284. The output of AND gate 268 controls inverter driver 286 which drives T-gate 288. The input to T-gate 288 is a wired connection of the outputs of T-gates 282 and 276. The output of T-gate 282 is also connected to inverter 290, the output of which is connected to T-gate 260. The output of T-gate 260 is connected to inverters 292 and 294 to provide isolation for the data output line 296 and the testability output 298. In addition, this output signal from T-gate 260 is also connected back through inverter 300 through T-gate 288 to provide an additional wired input for feedback to inverter 290. FIG. 15b is a truth table for the flip-flop of FIG. 15a showing the effect that the various states of the various inputs has on the output of the flip-flop. Again, the output of the testability output and the data output is the same.

Referring now to FIG. 16a, a more complex flip-flop 310 is shown. This flip-flop is more complex than the flip-flop of FIG. 15a in that it has SET input 312 connected to AND gate 314 and RESET input 316 connected with OR gate 318 as additional inputs. The SET input 312 also provides a second input to OR gate 318. RESET input 316 is connected through inverter 320 to provide a second input to AND gate 314. The output of AND gate 314 is inverted and connected as an input to AND gate 322. The output of OR gate 318 is connected and provided as one input to both AND gates 324 and 326. The clock enable input 328 is connected as the second input to AND gate 324. The clock enable input 328 is connected through inverter 330 to provide the second input to AND gate 326. The output of AND gate 324 is inverted and connected as one input @o OR gate 332. The output of OR gate 332 is one input to AND gate 322. The output of AND gate 326 is inverted and connected as one input to OR gate 334. The output of OR gate 334 is a third input to AND gate 322. The data input connection 336 goes through inverter 338 and provides a second input to OR gate 332. The output of AND gate 322 is inverted and connected to T-gate 340.

The testability input 342 is connected to T-gate 344. The clock input 346 is connected through inverter 348 to inverter 350. The normal operation (NOP) input 352 is connected through inverter 354 to AND gate 356. One output of inverter 348 provides the second input to AND gate 356. The output of AND gate 356 is connected to inverter driver 358 which controls T-gate 344. In addition, the normal operation input (NOP) 352 is connected to AND gate 360. AND gate 360 receives a second input from inverter 348. The output of AND gate 360 is inverted and controls inverter driver 362 which drives T-gate 340.

The output of transmission gate 344 and the output of transmission gate 340 are combined as inputs to inverter 364. The output of inverter 364 is connected as an input to transmission gate 366. Transmission gate 366 is controlled by the output of inverter 350 which has its output connected to inverter driver 368. The output of transmission gate 366 is connected to inverters 370 and 372 which provide the outputs of the flip-flop. The output of transmission gate 366 is also provided as the second input to OR gate 334.

Referring now to FIG. 16b, a truth table for the circuit of FIG. 16a is shown. As can be seen from the truth table, all the control features of the flip-flops shown in FIGS. 14a and 15a are present, but with the addition that the use of the SET and RESET inputs to the flip-flop can be used to force the output to a 0 or a 1, as desired.

The present invention has numerous advantages. One particular area of advantage of the present invention is the ease and convenience with which test operands may be loaded into a chip for testing of combinational logic, and the ease with which specific combinational logic units may be isolated for testing. Because loading of test operands into a particular area of a chip may be accomplished in parallel by direct gating through the testability gates on flip-flops skipping other combinational logic units, test routines may be run far more quickly and efficiently than previously. In particular, the long time period for loading and unloading required for typical scan designs is avoided.

Similarly, specific combinational logic elements within a chip may be tested and isolated from preceding and succeeding combinational logic units in a way either not previously possible or possible only with cumbersome techniques and a complex scan design. The various advantages of the scan design are primarily developed in connection with the flexibility that this design provides for test routines of various sorts. In addition to the flexibility of test routines that may be adopted, this design is also flexible in that several different types of flip-flops can be placed on a logic chip so as to avoid the restrictions of some previous test designs which required a single type of flip-flop in all locations in a logic chip.

This system can test with the same ease a restricted amount of combinational logic if it is before the first special flip-flop rank, between two flip-flop ranks or between the last flip-flop rank and output. Any of these sequences will not require the initialization of every flip-flop on the array to a predetermined value, which is very time consuming and requires a larger data base.

ALTERNATE EMBODIMENTS

Referring first to FIG. 17, in which a preferred embodiment circuit diagram 10 is shown, lines 101 and 102 have been added between the output from combinational logic rank 16 to the input of flip flop rank 50; and between the input of combinational logic rank 16 and the input of multiplexor rank 40, respectively.

Referring now to FIG. 13 (which the reader will note is exactly the same as FIG. 1, and FIGS. 3–12 insofar as organization of the boxes and lines are concerned), the test data input line 42 provides input to multiplexor 40 with the output 52 being provided to the normal data input of flip flop 50. In order for the serial scan mode to work properly, the test data input provided at line 42 should be provided to the test data input of flip flop 50, not the normal data input of flip flop 50. This would be apparent to anyone of ordinary skill in the art who stepped a series of data through lines 48 and 42 as described with reference to FIG. 13.

For example, with the SSM and NOP values set to zero, the flip flops in rank 50 would receive their input from line 48. (As defined, normal operation (NOP) means the test data input is disabled while the normal data input is enabled. Proof that this is correct can be had by reference to FIG. 7 and the description thereof.) The serial scan mode value is set to 1, the normal operation value (NOP) is set to zero initially, and then for one clock period to 1 and then to zero for the rest of the test. (Values for SSM and NOP are given for the preferred embodiment and are subject to vary per the designers choice.) In this way, logic rank 56 should be exercised and the results clocked out for verification. Thus, at the initial clock, normal operation of flip flop 50 (NOP) is zero causing it to receive test data at its test data input. Unfortunately, since the test data input line is line 48 with reference to flip flop 50, input register datum is clocked in. At the second clock, this input register datum will pass through the logic circuit in logic rank 56 to be received by flip flop 60 and normal operation is set to 1, allowing it to enter flip flop 60 via the normal data input. Subsequent movement of this output is from "test data out" to "test data in" through succeeding rank(s) of flip flops. In a scan chain the data is expected to go from the TDI input 42 through the chain of flip flops, bypassing the combinational logic and end up at the TDO output 36. Thus, the inconsistency with respect to serial scan mode becomes apparent, the data selected being input register data/input buffer output instead of TDI or scan chain data. This arrangement prevents a continuous scan chain through the logic. Whatever test data is accepted during NOP=0, will be from line 48, not from line 42. Therefore, as corrected, in FIG. 17, test data input provided at line 42 in serial scan mode (SSM) passes through multiplex rank 40 through line 52, which is the test data input to flip flop 50. So long as normal operation remains disabled or zero, at each clock pulse this input will be transferred from test data out of one flip flop rank to test data in of the next.

In FIG. 18, a slight variation from the connection shown to flip flop rank 50 in FIG. 17 is shown. Again, in this drawing, line 52 is the test data input to flip flop 50 and the test data output is separated from the normal output of flip flop 50. A variation in flip flop structure on the output is shown in flip flop 60, wherein only one output line is drawn, having an extra lead from that output drawn to the test data input of flip flop 90.

Some useful variations of routing which improve testability may occur along dotted line 70, as will become apparent later in this description.

FIG. 19 illustrates the fact that all flip flops could be constructed similarly to the flip flop shown in FIG. 18 as flip flop rank 60. In other words, the output from each specialized flip flop may be unitary and sent over two leads instead of having two leads emerge from the flip flop as shown in earlier figures. It was previously noted that in the case where there were two outputs the signal would be identical anyway.

In FIG. 20, the flip flops in ranks 50 and 60 are shown to be expanded into two pieces, a multiplexor 50A, whose normal operation input is the operational input to the multiplexor, and 50B, which operates as a normal flip flop. Flip flop rank 60 is similarly divided. This merely illustrates the fact that the flip flop as shown operates as if it were these two logical elements, and could be built as such. Note that the output lines 54 and 58 could also have been provided as two separate lines output from flip flop 50B.

FIG. 21 is comprised of FIG. 21A and FIG. 21B, illustrating two different forms of output buffers in which the output buffer resides at a physical location distant from the ranks of flip flops and combinational logic elements. In large-scale integrated circuit design, it may be useful to have the output buffer located on the periphery of the chip. In order to gain even further savings in space utilization on the chip, putting the switches and the multiplexors which are connected to the output buffers on the chip periphery would also be useful. This saves useful space at the interior of the chip for more logic gates and greater flexibility in chip design and functionality.

FIG. 22 presents another variation of the original design, which uses a 4 to 1 multiplexor with one of the inputs being an initialization function. The initialization function is provided by the second data line into the multiplexor 40A may be tied "hi" or "lo", depending on the designer's desire.

FIG. 23 shows a variation by the user of 41 multiplexors for initialization. The four to one multiplexor 43 is controlled by the NOP and SSM inputs and it replaces the 2 to 1 multiplexors 40A and 50A as represented in FIG. 20. The 4 to multiplexor operates as a front-end to flip flop 50. Multiplexor 65 is a similar construction operating as a front-end for flip flop 60.

The 2 to 1 multiplexors 47 and 67 act as front-ends for the rest of the flip flops in a rank, shown as flip flops 50 and 60, respectively.

This arrangement allows for the initialization of the flip flop ranks using the initialization value defined by the designer and fed through the input of the 4:1 multiplexors. This initialization value (zero or one) is shifted through the flip flops in a given rank (rank 50, for example), with the help of the 2:1 multiplexors (47, in this case) which can select the test data out from a flip flop to go into the test data in of the next one, under the control of a function of NOP and SSM signal inputs. The 2:1 multiplexors (47 and 65) operate as the front end to flip flops 50B(47) and 60B(65), just like they did in FIG. 20(50A and 60A). Thus, through Mux 43 and 65 the respective rows or chains of flip flops which follow may be initialized to 1 or 0 through the line TNT. The 21 Muxes 47 and 67 select their output as a function of the SSM and NOP inputs.

FIG. 24 shows an abridged set of flip flop ranks as they might be laid out on a chip, comprised of cells (for example A1-A6 would be a row of configurable cells, with Al configured to be a control hat and A2-A6 being specialized flip flops). It is not a requirement that all chains have the same length. Test data input lines are labeled TI, normal or operational data input lines are labeled D, TO is used for test data output and Q for normal output (TO and Q may be one and the same line).

Where the organization of test data lines is similar to that shown in all the other figures, the test data out from element $A_2$ would lead to the test data in of element $B_2$ (line 201) and A3 to B4, (line 202), respectively. A dotted line such as line 70 of FIG. 1, indicates that the test data line may go to a different flip flop. This is done to randomize the test data. This randomization is used to avoid reconvergence problems. In FIG. 24 the dotted line 202 shows such an out-of-sequence test data connection used to avoid reconvergence.

For purposes of randomizing the input test operands, one could introduce extra gates, inverters, and other devices, but the most efficient use of chip space would seem to be nonlinear passing through of the test data lines between ranks of flip flops. It should be recognized that the input register has pseudo-random number generating capabilities and is directed by the control register.

Referring now to FIG. 25, a reorganization of the test data inputs and outputs is shown which corresponds generally to that organization shown in FIG. 26. Note that to enhance randomization of test operands at stages in the flow input to output, all the inputs from the output of the input buffers (14) or built-in test input register/random number generator (26) are not provided in sequence to all two to one multiplexors (40).

FIG. 26 is a modified version of FIG. 24 with the general organization shown in FIG. 25. Where the first flip flop is at the top of a column of cells such as the element labeled $A_2$, the test data input line is the output of the two to one multiplexor, but the test data input and output lines from and to the succeeding elements in a column are simply routed to adjacent elements, until the last element in a column is reached. Then the test data path goes to the first flip flop element in another column (45), or to the first line 42 in the two to one multiplexor if the end of a chain of flip flops is reached. This organization of the test data lines is similar to that found in FIGS. 23 and 25.

Several features are worth further mention which are applicable across all the embodiments shown in the Figs.

SSM and LRFF may be provided from an input pin to the chip, independent of the input register (which is also the random number generator); or they could come from a control register bit as shown. The NOP function should come from an input pin independent from the random number generator.

The output register performs a check sum function.

In any location where a flip flop is shown, any clocked memory element might be used which could perform the same function. For example, in a counter or RAM element 2:1 multiplexors could choose the test data or normal data input for the memory elements.

One may use a limited number of flip flops to test only particular areas of the logic, if desired. Some memory elements or flip flops may exist in the chip which are not part of the test structure, of course, or all of them may be part of the test structure. In normal operation, flip flops are connected to the next flip flop rank through combinational logic but they may also during normal operation be directly connected, if no combinational logic is required between the two flip flop ranks.

The above description is not intended to be limited to exclude obvious variations in design therefrom.

What is claimed is:

1. An embedded test system for VLSI circuits comprising:

a VLSI chip having functional inputs and functional outputs, means for controlling test operation of said VLSI chip having a test control input, means for storing test data connected to said means for controlling test operation and connected to said functional inputs, a first rank of functional logic means comprising at least one functional logic element on said chip connected to said functional inputs, means for selectively connecting either said functional input or said means for storing test data to the input of said first functional logic element, at least a first rank of flip-flop means having two data inputs and two data outputs for providing a selectable data path, one of said inputs connected to the output of said first functional element and the other of said inputs connected to the input of said first functional element, said flip-flop means being controlled by said means for controlling test operation, at least a second rank of functional logic means on said chip having an input and an output, said input being connected to one output of said first rank of flip-flop means, output test data storage means selectively connected to receive the output from one of said two data outputs of the flip-flop means, means for selectively connecting either the output of said second rank of functional logic means or the second output of said first rank of flip-flop means to the functional output of said chip.

2. The test system of claim 1 comprising a plurality of ranks of functional logic means and ranks of flip-flop means connected in sequence so that each of said flip-flop means may have a selected input which bypasses at least one of said functional logic ranks.

3. The test system of claim 2 wherein at least some of said ranks of flip-flop means have fewer number of flip-flop units than others and in which the selectable inputs of some of said flip-flop means select inputs from different ranks of functional logic means to bypass said ranks of flip-flop means having fewer flip-flop units.

4. The test system of claim 2 in which more than one type of flip-flop is used in different ranks of flip-flop means.

5. The system of claim 1 in which said rank of flip-flop means comprises flip-flops wherein said flip-flops have:

first transmission gate means connected in a data path from a data input to said flip-flop, second transmission gate means connected in a test-ability input data path to said flip-flop, normal operation control gate means for controlling said first and second transmission gate means to control which of said input data paths are provided as the output of said flip-flop, clock signal control means for controlling the timing of the output of data in said output data path, clock enable input means for controlling the enabling of input data in said first data input path to said flip-flop, SET and RESET control means for said flip-flop for controlling the output of said flip-flop to be a predetermined quantity regardless of the input signal on either of said first or second data input paths, and two separate isolated data output paths from said flip-flop.

6. A test system for VLSI circuits having embedded test devices comprising:

A VLSI logic chip having input means and output means, a plurality of separate combinational logic elements arranged sequentially in ranks on said chip between said input means and said output means and constituting as a whole the desired logic function of the chip, a plurality of flip-flop means arranged in ranks sequentially connected between said ranks of combinational logic elements and each having two independent data paths, a first data path being connected from a firs input connected with the output of a preceding combinational logic element and the second input being connected to receive the input of a preceding combinational logic element, a first output of said flip-flop being connected to a succeeding combinational logic element and a second output of said flip-flop being available for connection to a succeeding rank of flip-flops which succeeds the adjacent rank of combinational logic elements, control means on said chip for controlling each rank of flip-flops to operate either in a normal operation mode in which the first data input is selected to provide a data input to said flip-flop from a preceding combinational logic element or from a preceding rank of flip-flops.

7. The test system of claim 6 comprising a plurality of ranks of functional logic means and ranks of flip-flop means connected in sequence so that each of said flip-flop means may have a selected input which bypasses at least one of said functional logic ranks.

8. The test system of claim 6 wherein at least some of said ranks of flip-flop means have fewer number of flip-flop units than others and in which the selectable inputs of some of said flip-flop means select inputs from different ranks of functional logic means to bypass said ranks of flip-flop means having fewer flip-flop units.

9. The test system of claim 6 in which more than one type of flip-flop is used in different ranks of flip-flop means.

10. The system of claim 6 in which said rank of flip-flop means comprises flip-flops wherein each said flip-flop has first transmission gate means connected in a data path from a data input to said flip-flop, second transmission gate means connected in a testability input data path to said flip-flop, normal operation control gate means for controlling said first and second transmission gate means to control which of said input data paths are provided as the output of said flip-flop, clock signal control means for controlling the timing of the output of data in said output data path, clock enable input means for controlling the enabling of input data in said first data input path to said flip-flop, SET and RESET control means for said flip-flop for controlling the output of said flip-flop to be a predetermined quantity regardless of the input signal on either of said first or second data input paths, and two separate isolated data output paths from said flip-flop.

11. The logic chip of claim 6, wherein said control means includes a control register having a test data input and an input register means for serially receiving test data, input operands and control signals, means for switchably connecting said input register means in parallel to the input of said combinational logic units, output register means connected to receive the outputs of the last in sequence of the ranks of combinational logic units on said chip and having test data output means for transmitting said data from said chip in serial fashion.

12. The test system of claim 11 comprising a plurality of ranks of functional logic means and ranks of flip-flop means connected in sequence so that each of said flip-flop means may have a selected input which bypasses at least one of said functional logic ranks.

13. The test system of claim 11 wherein at least some of said ranks of flip-flop means have fewer number of flip-flop units than others and in which the selectable inputs of some of said flip-flop means select inputs from different ranks of functional logic means to bypass said ranks of flip-flop means having fewer flip-flop units.

14. The test system of claim 11 in which more than one type of flip-flop is used in different ranks of flip-flop means.

15. The system of claim 11 in which said rank of flip-flop means comprises flip-flop wherein each said flip-flop has:
  first transmission gate means connected in a data path from a data input to said flip-flop,
  second transmission gate means connected in a testability input data path to said flip-flop,
  normal operation control gate means for controlling said first and second transmission gate means to control which of said input data paths are provided as the output of said flip-flop,
  clock signal control means for controlling the timing of the output of data in said output data path,
  clock enable input means for controlling the enabling of input data in said first data input path to said flip-flop,
  SET and RESET control means for said flip-flop for controlling the output of said flip-flop to be a predetermined quantity regardless of the input signal on either of said first or second data input paths, and
  two separate isolated data output paths from said flip-flop.

16. A flip-flop comprising:
  first transmission gate means connected in a data path from a data input to said flip-flop,
  second transmission gate means connected in a testability input data path to said flip-flop,
  normal operation gate means for controlling said first and second transmission gate means to control which of said input data paths are provided as the output of said flip-flop,
  clock signal control means for controlling the timing of the output of data in said output data path,
  clock enable input means for controlling the enabling of input data in said first data input path to said flip-flop,
  SET and RESET control means for said flip-flop for controlling the output of said flip-flop to be a predetermined quantity regardless of the input signal on either of said first or second data input paths, and
  two separate isolated data output paths from said flip-flop.

17. A test system for VLSI circuits having embedded test devices comprising:
  A VLSI logic chip having inpuh means and output means,
  a plurality of separate combinational logic elements arranged sequentially in ranks on said chip between said input means and said output means and constituting as a whole the desired logic function of the chip,
  a plurality of flip-flop means arranged in ranks sequentially connected between said ranks of combinational logic elements and each having two independent data paths, the first data path being connected from a first input connected with the output of a preceding combinational logic element and a second input being connected to receive the input of a preceding combinational logic element, said flip-flop having at least one data output path,
  control means on said chip for controlling each rank of flip-flops to operate either in a normal operation mode in which the first data input is selected to provide a data input to said flip-flop from a preceding combinational logic element or from a preceding rank of flip-flops.

18. The test system of claim 17 comprising a plurality of ranks of functional logic means and ranks of flip-flop means connected in sequence so that each of said flip-flop means may have a selected input which bypasses at least one of said functional logic ranks.

19. The test system of claim 17 wherein at least some of said ranks of flip-flop means have fewer number of flip-flop units than others and in which the selectable inputs of some of said flip-flop means select inputs from different ranks of functional logic means to bypass said ranks of flip-flop means having fewer flip-flop units.

20. The test system of claim 17 in which more than one type of flip-flop is used in different ranks of flip-flop means.

21. In an integrated circuit having: a plurality of input pins, a set of circuit units comprising a plurality of flip flops and combinational logic wherein the flip flops have a conventional data input and at least one output connected to said combinational logic, an on chip maintenance test system having an input register and switching means for selectively connecting the inputs to the circuit units between the input pins or the input register; wherein said integrated circuit has:
  at least some of said flip flops being specialized flip flops, operable in either a test mode or a normal operating mode, wherein said flip flops have a test data input which operates to the exclusion of said data input in said test mode and having input means for selecting which mode is enabled.

22. An integrated circuit as set forth in claim 21, wherein said specialized flip flops are so arranged and disposed to form a plurality of logic chains such that output of one specialized flip flop is provided to the test data input of the next specialized flip flop after clocking through the one, throughout each chain of specialized flip flops.

23. Circuit units as set forth in claim 22 wherein said combinational of logic is organized into ranks and wherein said flip-flop output connected to one of said combinational logic ranks connects through that rank to the next flip-flop in said chain by said next flip-flop's conventional data input.

24. Circuit units as set forth in claim 22 wherein said combinational logic is arranged into ranks and wherein said flip-flop output connected to one of said combinational logic ranks connects through said rank into the conventional input of a flip-flop in another chain.

25. An integrated circuit as set forth in claim 21 further comprising multiplexor means to select between a test data input pin and the test data provided by said switching means output, having said multiplexor means output connected to said specialized flip flop test data input.

26. An integrated circuit as set forth in claim 22 further including a multiple bit output register and wherein an output of the last specialized flip flop in a logic chain is selectably connectable to the test data input of the first specialized flip flop in the next subsequent chain through a multiplexor and directly or through combinational logic to either an output pin or a bit of the output register.

27. An integrated circuit as set forth in claim 26, wherein cases where the lash flip flop in a chain has an output through combinational logic, an additional multiplexor means, controlled by a control signal, selects whether the flip flop output goes through the combinational logical to the output pin or the output register or whether the combinational logic is bypassed.

28. An integrated circuit as set forth in claim 21 wherein each specialized flip flop mode select input is derived directly from one input pin.

29. An integrated circuit as set forth in claim 22 wherein each specialized flip flop mode select input is derived directly from one input pin.

30. An integrated circuit as set forth in claim 25 wherein each specialized flip flop mode select input is derived directly from one input pin.

31. An integrated circuit as set forth in claim 26 wherein each specialized flip flop mode select input is derived directly from one input pin.

32. An integrated circuit as set forth in claim 27 wherein each specialized flip flop mode select input is derived directly from one input pin.

33. In an integrated circuit having:
a plurality of input pins, a set of specialized combinational logic units comprising a plurality of flip flops and combinational logic wherein said flip flops have a conventional data input and an output which is connected as an input to said combinational logic, an on chip maintenance test system having an input register/random number generator and switching means for selectively connecting the combinational logic unit between a set of the input pins or the input register; wherein said integrated circuit has: specialized flip flops being operable in either a test mode or a normal operating mode, and wherein said flip flops have a test data input and a test data output which operate in said test mode, and having a mode select input to select which mode is enabled; wherein said specialized flip flops are so arranged and disposed to form a plurality of logic chains with the test data output of one specialized flip flop in such chain connected to the test data input of the next in such chain, and wherein said test data outputs of each preceding flip flop in the chain is connected to the test data input of each subsequent flip flop in the chain, and having switching means for selectively connecting the conventional data input to said specialized flip flops from an input pin or from the input register.

34. In an on chip maintenance test system as set forth in claim 33, wherein the test data outputs are connected to the test data inputs of the memory elements in such a way to randomize the test operands to prevent reconvergence.

35. In a VLSI circuit having combinational logic, input pin means, and output pin means; an on-chip maintenance test system comprising:
a control register having a plurality of outputs and having an input connected to an input pin,
an input register having pseudo-random number generating capabilities connected to said control register for input and having a plurality of outputs,
a set of memory elements having data and test inputs selectably enabled by a third input, and having at least one output, wherein the data and test inputs are selectably connected to receive output from said combinational logic or to receive output from another of said memory elements,
an output register connected in series to said input register and in parallel to said output pin means,
a first set of multiplexor means one of which has a first input connected to an off-chip test data input pin and the rest of which receive their first input from said memory element outputs, all of which also have a second input and an output connected to the test input of said set of memory elements,
first switching means for selectively connecting said second input of said first set of multiplexor means between a set of said input pins and said input register.

36. An on-chip maintenance test system as set forth in claim 35 further comprising:
second switching means which has a multiplexor means for selectively connecting either the output of said combinational logic or the outputs of a set of said set of memory elements between a set of said output pin means and said output register.

37. In a VLSI circuit having combinational logic, input pin means, and output pin means; an on-chip maintenance test system comprising:
a control register having a plurality of outputs and having an input connected to an input pin,
an input register having pseudo-random number generating capabilities connected to said control register for input and having a plurality of outputs,
a set of memory elements having an input and an output,
a set of two to one multiplexors having a test data input and a data input and having an output, each said output being connected to the input of one of said set of memory elements, for selectably connecting said memory element between output from said combinational logic or output from another memory element,
a set of four to one multiplexors connected to receive NOP and SSM signals as control inputs and having inputs to receive initialization, test data input, first switching means output, and output from either combinational logic or from a memory element, one of said four to one multiplexors receiving its test data input from the test data input pin means, and
first switching means for selectively connecting said first switching means output between a set of
said input pin means and said input register.

38. An on chip maintenance test system as set forth in claim 37 further comprising:
an output register with checksumming capability connected to receive the data output from the last rank of memory elements or from the last rank of combinational logic.

* * * * *